US011452181B2

(12) United States Patent
Kobayashi et al.

(10) Patent No.: US 11,452,181 B2
(45) Date of Patent: Sep. 20, 2022

(54) INDUCTION COOKTOP WITH AN EXHAUST AIR GUIDE

(71) Applicant: Mitsubishi Electric Corporation, Tokyo (JP)

(72) Inventors: Akihiko Kobayashi, Tokyo (JP); Akira Shiga, Tokyo (JP); Sota Komae, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 161 days.

(21) Appl. No.: 16/636,954

(22) PCT Filed: Sep. 13, 2017

(86) PCT No.: PCT/JP2017/032949
§ 371 (c)(1),
(2) Date: Feb. 6, 2020

(87) PCT Pub. No.: WO2019/053793
PCT Pub. Date: Mar. 21, 2019

(65) Prior Publication Data
US 2020/0374991 A1    Nov. 26, 2020

(51) Int. Cl.
*H05B 6/12* (2006.01)
*F24C 15/00* (2006.01)
*H05K 7/20* (2006.01)

(52) U.S. Cl.
CPC ......... *H05B 6/1263* (2013.01); *F24C 15/006* (2013.01); *H05B 2206/022* (2013.01); *H05K 7/20145* (2013.01)

(58) Field of Classification Search
CPC .. F24C 15/006; F24C 15/00; H05B 2206/022; H05B 6/1263; H05B 6/12;
(Continued)

(56) References Cited

U.S. PATENT DOCUMENTS 2,526,890 A * 10/1950 Mendel .................. F24C 3/027
126/21 R
4,490,596 A * 12/1984 Hirai .................... H05B 6/1263
126/21 A
(Continued)

FOREIGN PATENT DOCUMENTS

JP    2002-093559 A    3/2002
JP    2002-134255 A    5/2002
(Continued)

OTHER PUBLICATIONS

International Search Report of the International Searching Authority dated Nov. 7, 2017 for the corresponding international application No. PCT/JP2017/032949 (and English translation).

*Primary Examiner* — Joel M Attey
*Assistant Examiner* — Adam Michael Eckardt
(74) *Attorney, Agent, or Firm* — Posz Law Group, PLC

(57) ABSTRACT

A heating cooker includes a housing having an exhaust aperture; a top plate on the housing with a heating zone; a heating coil to perform induction heating to heat a heating target on the heating zone; an air-sending device; a cooling air guide having an air outlet, to guide air from the air-sending device to the air outlet; and an exhaust air guide aperture with an air passage extending from a first inlet to a first outlet. The air outlet and the exhaust aperture are aligned with each other and the air outlet of the cooling air guide and the heating coil are aligned each other, both in the front and back direction. The air outlet is arranged on a front side relative to a center of the heating coil. The air passage of the exhaust air guide has a longer length than the first outlet of the air passage.

11 Claims, 26 Drawing Sheets

(58) Field of Classification Search
CPC . H05B 1/00; H05B 31/24; H05B 6/00; H05K 7/20145
See application file for complete search history.

(56) References Cited

U.S. PATENT DOCUMENTS

2017/0067647 A1* 3/2017 Wie .................. F24C 15/006
2017/0257913 A1* 9/2017 Vengroff ............. H05B 6/1209

FOREIGN PATENT DOCUMENTS

| | | |
|---|---|---|
| JP | 2002-299026 A | 10/2002 |
| JP | 2002-313550 A | 10/2002 |
| JP | 2004-235124 A | 8/2004 |
| JP | 2009-201591 A | 9/2009 |
| JP | 2010-192302 A | 9/2010 |
| JP | 2012-054146 A | 3/2012 |
| JP | 2014-116268 A | 6/2014 |

* cited by examiner

Comparative Example

INDUCTION COOKTOP WITH AN EXHAUST AIR GUIDE

CROSS REFERENCE TO RELATED APPLICATION

This application is a U.S. national stage application of PCT/JP2017/032949 filed on Sep. 13, 2017, the contents of which are incorporated herein by reference.

TECHNICAL FIELD

The present disclosure relates to a heating cooker having an exhaust aperture for cooling air that cools a component inside a heating cooker.

BACKGROUND ART

In general, a ventilator is disposed above a heating cooker, and steam or smoke that is generated during cooking is sucked into the ventilator and is discharged out of a room. In a cooker that uses fire, such as a gas stove, surrounding air that is warmed by the fire is turned to be an ascending air current, and the ascending air current acts to guide the steam or the smoke that is generated during the cooking to the ventilator. On the other hand, a heating cooker that uses a heating coil or an electric heater as a heating source hardly warms the surrounding air compared to a cooker that uses fire, as a result of which an ascending air current is hardly generated. Therefore, a part of the steam or the smoke that is generated during the cooking may not easily reach the ventilator.

With such facts as background, a heating cooker including a cooling fan and an exhaust fan has been proposed, the cooling fan causing an air flow that cools a component inside the heating cooker to be generated and the exhaust fan causing an air flow that guides the steam or the smoke generated during the cooking to the ventilator, disposed above the heating cooker, to be generated (refer to, for example, Patent Literature 1).

CITATION LIST

Patent Literature

Patent Literature 1: Japanese Unexamined Patent Application Publication No. 2002-313550 (claim 1)

SUMMARY OF INVENTION

Technical Problem

However, as in the technology in Patent Literature 1 given above, when a dedicated exhaust fan is disposed separately from the cooling fan, manufacturing costs of the heating cooker are increased. When there is an excessive amount of air flow from the exhaust fan, the air speed is too high, or the air flow is improperly orientated, the steam or smoke cannot be guided to the ventilator. Therefore, in order to guide the steam or smoke to the ventilator, complicated designing is required in relation to, for example, the capacity of the exhaust fan, a control program of the exhaust fan, and the orientation of the air flow from the exhaust fan. The dedicated exhaust fan can also be the cause of noise.

The present disclosure has been made with such problems above as a background, and provides a heating cooker that can guide steam or smoke that is generated during cooking to a ventilator by making use of an air flow from a cooling fan that the heating cooker includes without providing a dedicated exhaust fan.

Solution to Problem

A heating cooker according to an embodiment of the present disclosure includes a housing having an exhaust aperture formed on an upper surface thereof; a top plate disposed on the housing, and provided with a heating zone disposed, in plan view, on a front side relative to the exhaust aperture; a heating coil configured to perform induction heating to heat a heating target placed on the heating zone; an air-sending device; a cooling air guide having an air outlet, and configured to guide an air flow from the air-sending device to the air outlet; and an exhaust air guide disposed over the exhaust aperture, the exhaust air guide being formed with an air passage extending from a first inlet to a first outlet locating upper than the first inlet. In plan view, the air outlet of the cooling air guide and the exhaust aperture are aligned each other in a front and back direction. In plan view, the air outlet of the cooling air guide and the heating coil are aligned each other in the front and back direction. In plan view, the air outlet is arranged on a front side relative to a center of the heating coil. The air passage of the exhaust air guide has a length longer than a length of the first outlet of the air passage in the front and back direction.

Advantageous Effects of Invention

According to an embodiment of the present disclosure, an air flow guided by the cooling air guide and cooled inside the housing passes through the air passage formed in the exhaust air guide disposed over the exhaust aperture of the housing, and flows out the housing. It is possible to, by using an air flow that has been rectified by the cooling air guide and the exhaust air guide, guide steam or smoke that is generated during cooking to the ventilator.

DESCRIPTION OF EMBODIMENTS

Heating cookers according to embodiments of the present disclosure are described below with reference to the drawings. The present disclosure is not limited by the forms of the drawings indicated below. In the description below, for facilitating understanding, the terms that indicate directions (such as "up", "down", "right", "left", "front", and "back") are used as appropriate. However, these terms are used for descriptive purposes and are not restrictive. The terms indicating directions are used with reference to the positions of exhaust apertures of the heating cooker. Of the front, back, left, and right of the heating cooker, a side where the exhaust apertures are formed is called "back". In each of the figures, components with the same reference signs are the same or corresponding components, and this is common throughout the whole description.

Embodiment 1

Figure 1:
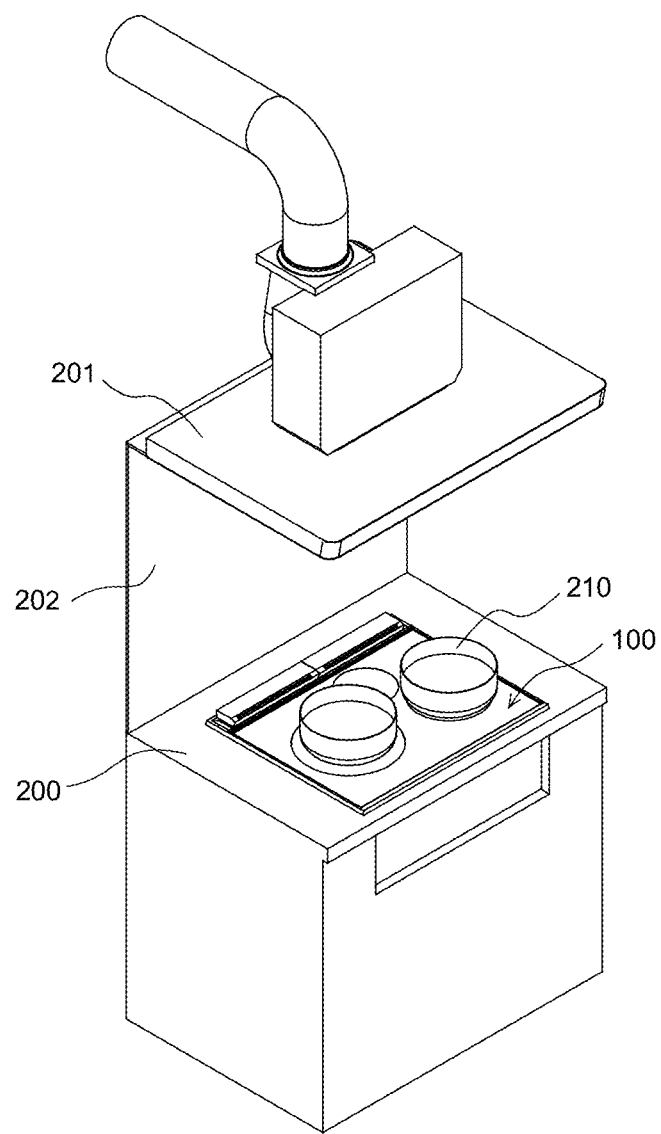
FIG. 1 illustrates a system configuration including a heating cooker 100 according to Embodiment 1.

First, an example of disposing a heating cooker 100 according to Embodiment 1 is described. FIG. 1 illustrates a system configuration including the heating cooker 100 according to Embodiment 1. FIG. 1 illustrates an example in which the heating cooker 100 is disposed in a so-called wall-mounted kitchen. At a position near a kitchen wall 202, the heating cooker 100 is installed in kitchen furniture 200. A ventilator 201 is disposed above the heating cooker 100. In general, the ventilator 201 includes, for example, a hood that covers the heating cooker 100 from above, a ventilating fan, and a grease filter that is disposed on the hood and that suppresses entry of oil into the ventilating fan. A cooking container 210, such as a pot or a frying pan, is placed on the heating cooker 100 disposed in this way, and food in the cooking container 210 is heated and cooked.

Figure 2:
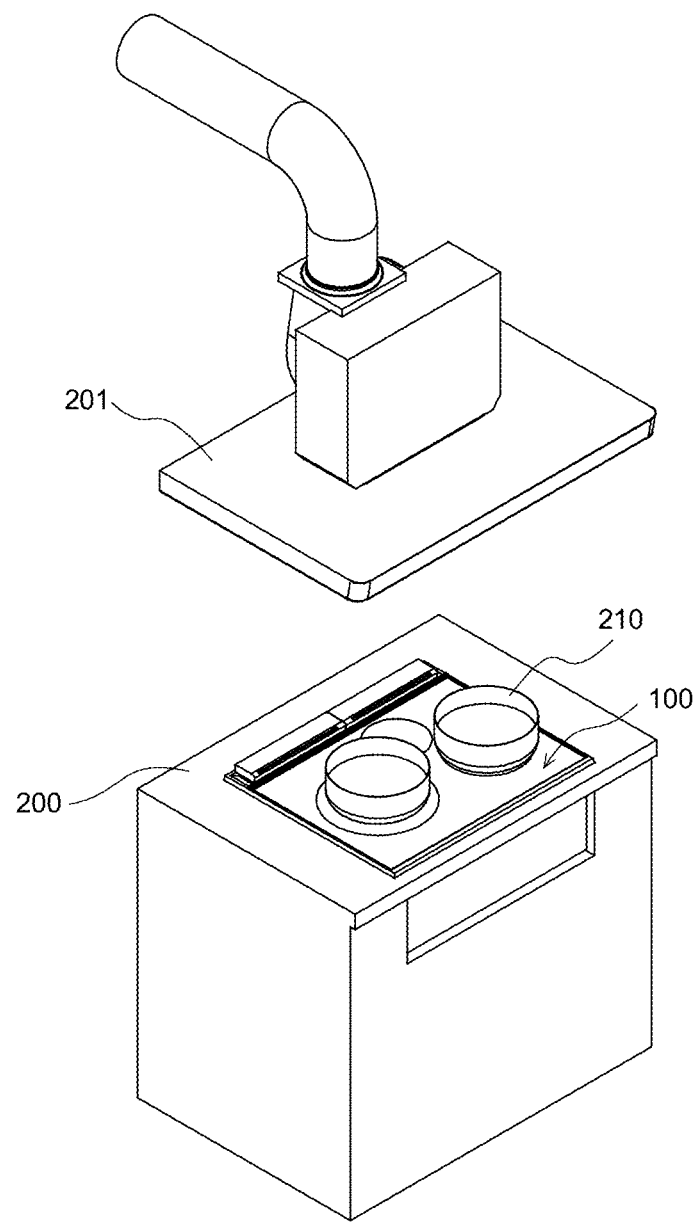
FIG. 2 illustrates another system configuration including the heating cooker 100 according to Embodiment 1.

FIG. 2 illustrates another system configuration including the heating cooker 100 according to Embodiment 1. FIG. 2 illustrates an example in which the heating cooker 100 is disposed in a so-called island kitchen or peninsula kitchen. In FIG. 2, the kitchen wall 202 shown in FIG. 1 does not exist, and, in general, a living room space or a dining room space is positioned behind the heating cooker 100.

There are various restrictions imposed on disposition of the heating cooker 100 due to the ventilator 201, the kitchen wall 202, and the kitchen furniture 200. For example, there exists a fire prevention ordinance prescribing an installation standard requiring disposition of the grease filter, which is provided at the ventilator 201, 80 cm or more away from a surface of heating equipment. Therefore, in general, for example, installation work instructions for the ventilator 201 prescribe that a lower end of the ventilator 201 and an upper surface of the heating cooker 100 must be 80 cm or more apart from each other. There also exists a fire prevention ordinance prescribing that the width and the depth dimension of the hood of the ventilator 201 must be greater than or equal to the width and the depth dimension of the heating equipment. When the kitchen wall 202 is a flammable wall, that is, when the kitchen wall 202 is not a wall having a fireproof structure, there exists a fire prevention ordinance prescribing that the heating cooker 100 must be disposed with the kitchen wall 202 and a heating zone being apart from each other by a distance greater than or equal to 15 cm. Kitchen furniture standards (such as Certification Standards for Quality Housing Components (BLS KS: 2015) of "Center of Better Living") also exist. Under such restrictions, the positional relationship between the heating cooker 100 and the ventilator 201 is generally standardized.

Figure 3:
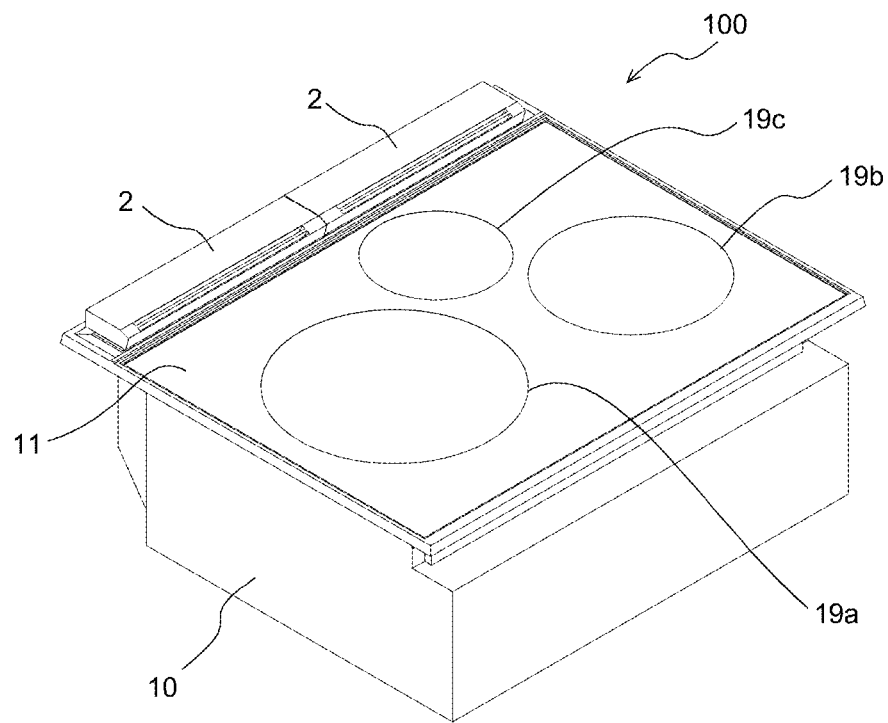
FIG. 3 is a perspective view of the heating cooker 100 according to Embodiment 1.

Next, a structure of the heating cooker 100 according to Embodiment 1 is described. FIG. 3 is a perspective view of the heating cooker 100 according to Embodiment 1. The heating cooker 100 includes a housing 10 and a top plate 11 that is disposed on the housing 10. The top plate 11 is provided with heating zones 19a, 19b, and 19c on which cooking containers are placed. Here, portions of the top plate 11 that are capable of heating the cooking containers are called the heating zones 19a, 19b, and 19c. Indications that indicate the heating zones 19a to 19c are provided on the top plate 11. Two exhaust air guides 2 are disposed at a back portion of the heating cooker 100. The exhaust air guides 2 are disposed over exhaust apertures 12a and 12b (see FIG. 4) formed on the housing 10. In plan view, the heating zones 19a to 19c are provided on a front side relative to the exhaust air guides 2.

Figure 4:
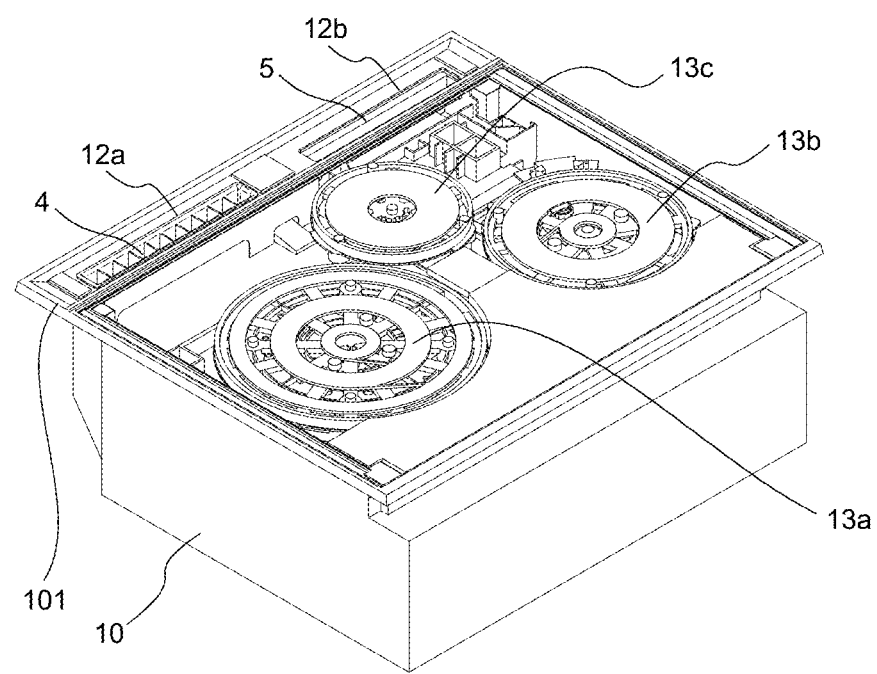
FIG. 4 is a perspective view of the heating cooker 100 according to Embodiment 1 when a top plate 11 thereof has been removed.

FIG. 4 is a perspective view of the heating cooker 100 according to Embodiment 1 when the top plate 11 thereof has been removed. Heating coils 13a, 13b, and 13c, which are heating units, are disposed inside the housing 10. The heating coils 13a to 13c are disposed at positions corresponding to the positions of heating zones 19a to 19c shown in FIG. 3. The heating coils 13a to 13c may each be formed from one heating coil or may include a plurality of heating coils that are separately driven. For example, though the heating coil 13a includes three separately driven heating coils that are concentrically disposed, the three heating coils are handled as the heating coil 13a whose coils are grouped together. This similarly applies to the other heating coils 13b and 13c.

The two exhaust apertures 12a and 12b are provided side by side on the left and right in the housing 10 and behind the heating coils 13a to 13c. In Embodiment 1, the housing 10 has a substantially box shape with an opening on an upper side. A rectangular upper frame 101, which is a part of the housing 10, defines an opening edge of the upper side of the housing 10. The exhaust apertures 12a and 12b are formed so that the upper frame 101 and the housing 10 communicate with each other.

A first air guide 4 that guides an air flow toward the exhaust aperture 12a from the inside of the housing 10 is disposed below the left exhaust aperture 12a inside the housing 10, and a second air guide 5 that guides an air flow toward the exhaust aperture 12b from the inside of the housing 10 is disposed below the right exhaust aperture 12b.

Figure 5:
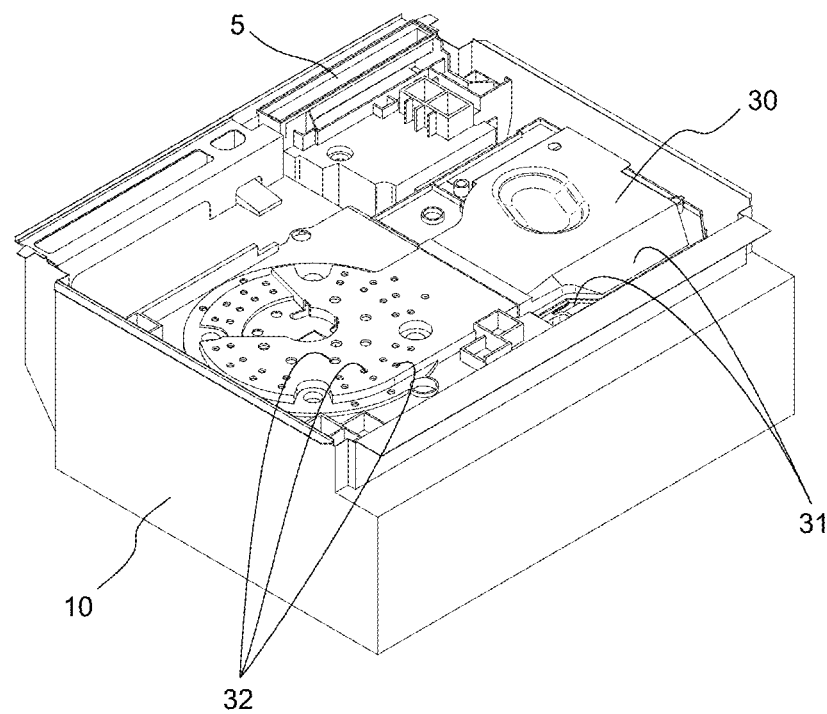
FIG. 5 is a perspective view illustrating an internal structure of the heating cooker 100 according to Embodiment 1.

FIG. 5 is a perspective view illustrating an internal structure of the heating cooker 100 according to Embodiment 1. FIG. 5 illustrates the internal structure when the heating coils 13a to 13c, the upper frame 101, and the first air guide 4 have been removed from the state shown in FIG. 4. A first cooling air guide 30 is disposed inside the housing 10. The first cooling air guide 30 is provided for guiding cooling air sent out from an air-sending device 14 (see FIG. 6) described below to a cooling target via first air outlets 31 and second air outlets 32, the cooling target being disposed inside the housing. The first cooling air guide 30 has a substantially plate shape, and is disposed to partition in an up and down direction the inside of the housing 10 by a plane of the plate-shaped portion.

The first cooling air guide 30 has the plurality of first air outlets 31 and the plurality of second air outlets 32. The first air outlets 31 and the second air outlets 32 extend through the first cooling air guide 30 in the up and down direction. At least a part of the first air outlets 31 are provided on a front side relative to a center of the heating coil 13b (see FIG. 4) placed on the first cooling air guide 30. At least a part of the second air outlets 32 are provided on a front side relative to a center of the heating coil 13a (see FIG. 4) placed on the first cooling air guide 30. The shapes of the illustrated first air outlets 31 and the illustrated second air outlets 32 are examples, and the shapes of the first air outlets 31 and the second outlets 32 are determined depending on the shape and the disposition of the cooling target.

Figure 6:
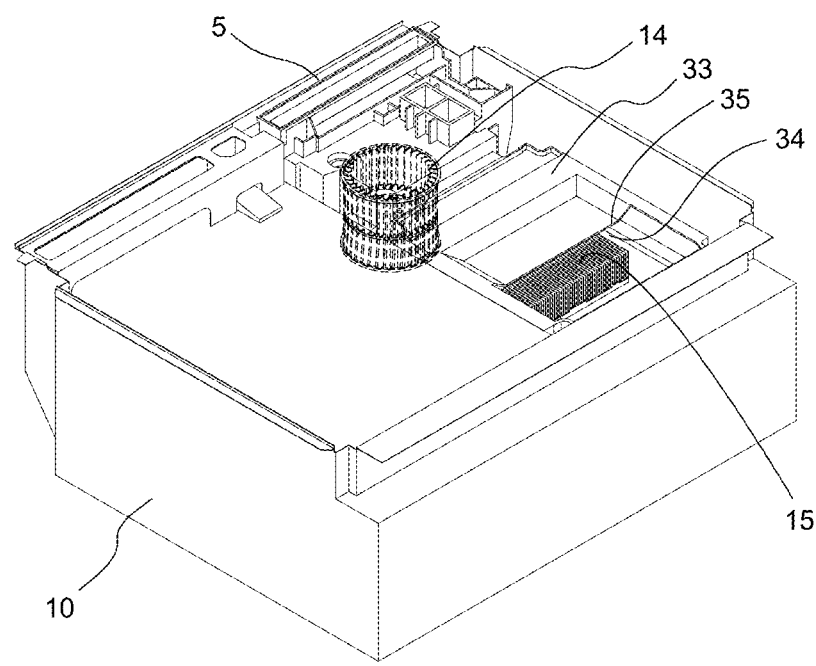
FIG. 6 is a perspective view illustrating an internal structure of the heating cooker 100 according to Embodiment 1.

FIG. 6 is a perspective view illustrating an internal structure of the heating cooker 100 according to Embodiment 1. FIG. 6 illustrates the internal structure when the first cooling air guide 30 has been removed from the state shown in FIG. 5. The air-sending device 14 that is accommodated inside the housing 10 is shown by a broken line. The air-sending device 14 is accommodated toward the back side of the housing 10. A second cooling air guide 33 is disposed on a front side relative to the air-sending device 14. An air passage 34 is formed in the second cooling air guide 33. Cooling air from the air-sending device 14 is guided to a location below the first cooling air guide 30 (see FIG. 5). An air outlet 35 is formed at a front side of the second cooling air guide 33. The first cooling air guide 30 and the second cooling air guide 33 communicate with each other via the air outlet 35. A driving device 15 is accommodated in the air passage 34. The driving device 15 includes components that generate heat, such as an inverter circuit that drives the heating coils 13a to 13c and a control circuit that controls the operation of the heating cooker 100.

Figure 7:
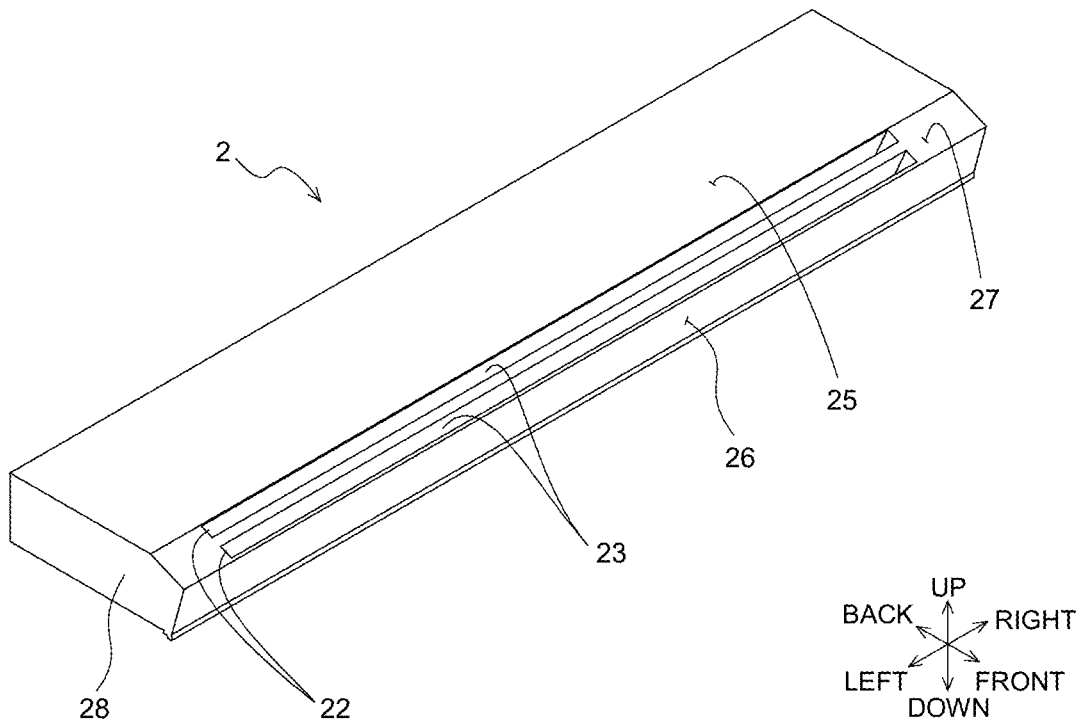
FIG. 7 is a perspective view of an upper side of an exhaust air guide 2 according to Embodiment 1.
Figure 8:
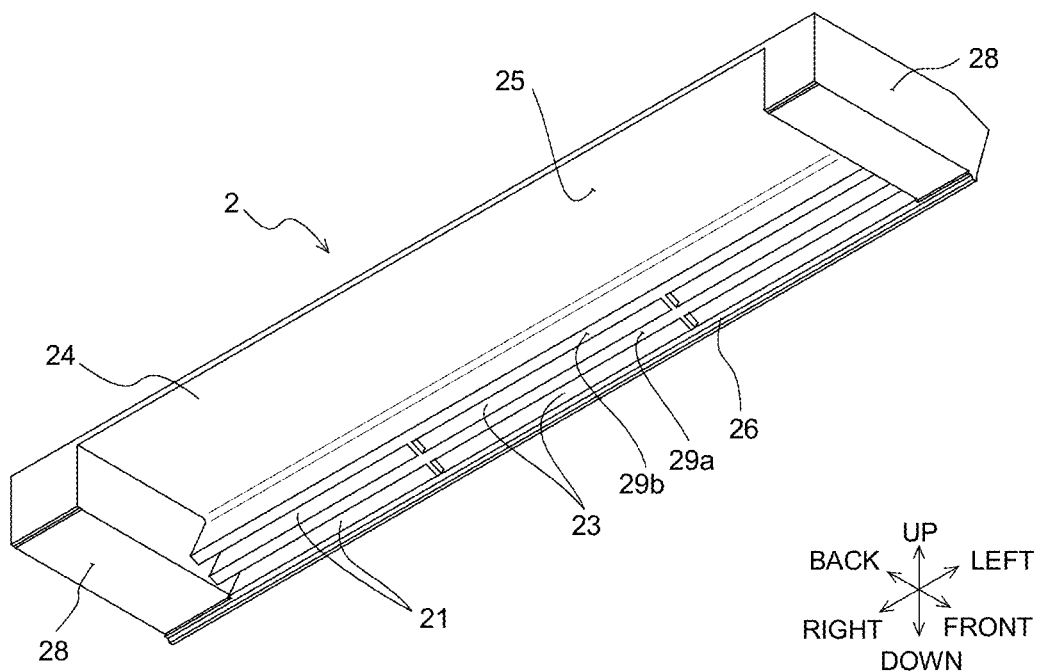
FIG. 8 is a perspective view of a lower side of the exhaust air guide 2 according to Embodiment 1.

FIG. 7 is a perspective view of an upper side of an exhaust air guide 2 according to Embodiment 1. FIG. 8 is a perspective view of a lower side of the exhaust air guide 2 according to Embodiment 1. With reference to FIGS. 7 and 8, a structure of each exhaust air guide 2 is described. The exhaust air guides 2 have a substantially rectangular external shape, and are placed on the respective exhaust apertures 12a and 12b, with a longitudinal direction being along a left and right direction of the heating cooker 100 (see FIG. 3).

Each exhaust air guide 2 includes an upper plate 25 whose flat surface is disposed substantially horizontally, a front plate 26, an inclined plate 27 that is formed continuously between the upper plate 25 and the front plate 26, and a pair of left and right side plates 28. A space that is surrounded by these plates is formed inside each exhaust air guide 2.

Each exhaust air guide 2 has air passages 23 penetrating therethrough in the up and down direction. A lower-end opening of each air passage 23 is called a first inlet 21, and an upper-end opening of each air passage 23 is called a first outlet 22. As shown in FIG. 8, a back side of each exhaust air guide 2 is not provided with a wall, and is provided with an opening. This opening is called a second outlet 24. Two ribs 29a and 29b are disposed at a lower surface of each upper plate 25 and apart from each other by a gap, the two ribs 29a and 29b being provided over the entire inside width of the exhaust air guide 2 and extending in a substantially up and down direction. A gap is also provided between each front rib 29a and its corresponding front plate 26. The gap between each front plate 26 and its corresponding front rib 29a and the gap between each rib 29a and its corresponding rib 29b form the air passages 23.

As shown in FIG. 7, each inclined plate 27 provided at the front side of its corresponding exhaust air guide 2 extends downward in a forward direction. In a state where the exhaust air guides 2 are disposed over the respective exhaust apertures 12a and 12b (see FIG. 3), the inclined plates 27 face a user using the heating cooker 100. When each inclined plate 27 that extends downward in the forward direction is disposed to face the user, the user recognizes that a height difference between each exhaust air guide 2 and the top plate 11 is small. Therefore, the sense of protrusion of each exhaust air guide 2 is reduced and the design of the heating cooker 100 is improved.

As shown in FIG. 7, an opening side of each first outlet 22 that is formed in its corresponding inclined plate 27 also extends downward in the forward direction as with each inclined plate 27. Further, as shown in FIG. 8, an opening side of each first inlet 21 is substantially parallel to the opening side of its corresponding first outlet 22 and extends downward in the forward direction. In Embodiment 1, by positioning lower ends of the ribs 29a and 29b that form the air passages 23 closer to an upper side as toward the back, the opening side of each first inlet 21 is inclined.

Figure 9:
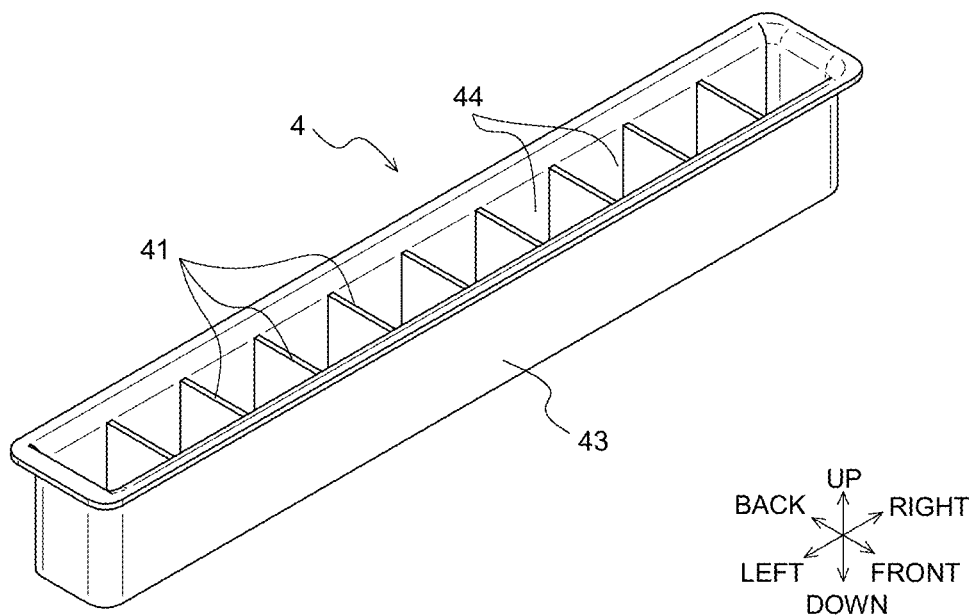
FIG. 9 is a perspective view of an upper side of a first air guide 4 according to Embodiment 1.
Figure 10:
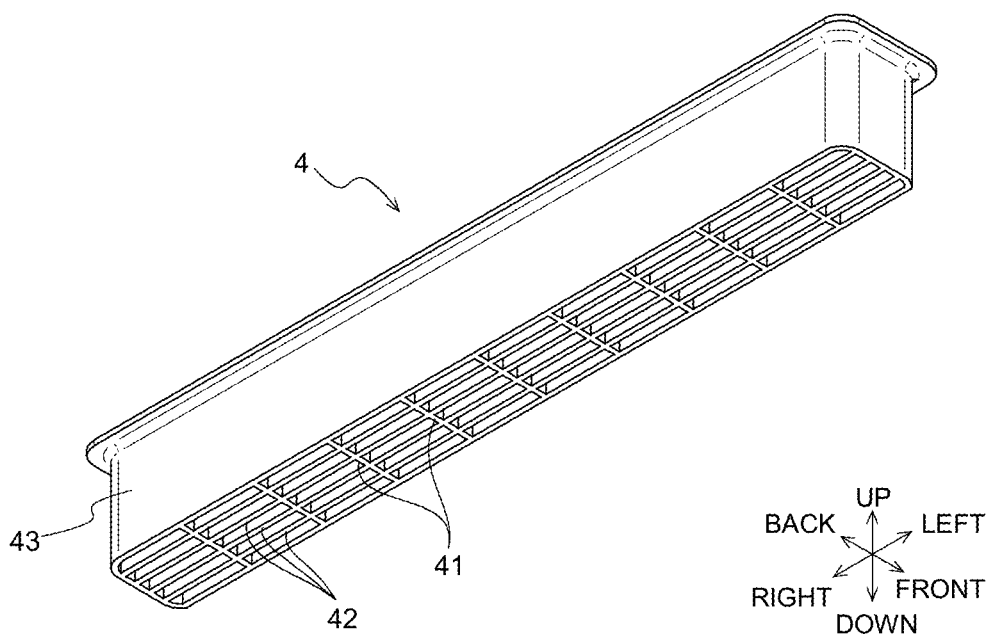
FIG. 10 is a perspective view of a lower side of the first air guide 4 according to Embodiment 1.

FIG. 9 is a perspective view of an upper side of the first air guide 4 according to Embodiment 1. FIG. 10 is a perspective view of a lower side of the first air guide 4 according to Embodiment 1. The first air guide 4 includes a rectangular outer frame 43 that is a through frame in the up and down direction, and first rectifying plates 41 and second rectifying plates 42 that are provided on an inner side of the outer frame 43. The inside of the outer frame 43 of the first air guide 4 is called an air passage 44. The first rectifying plates 41 and the second rectifying plates 42 are integrated with the outer frame 43. The first rectifying plates 41 are disposed so that their flat surfaces extend in a front and back direction, and rectify turbulence in the left and right direction of an air flow that passes between the plurality of first rectifying plates 41. As shown in FIGS. 9 and 10, the first rectifying plates 41 are disposed from a lower end of the outer frame 43 to substantially an upper end. As shown in FIG. 10, the second rectifying plates 42 are disposed so that their flat surfaces extend in the left and right direction, and rectify a turbulence in the front and back direction of an air flow that passes between the plurality of second rectifying plates 42. The height of the second rectifying plates 42 is lower than the height of the first rectifying plates 41, and the position of an upper end of each second rectifying plate 42 is lower than the position of an upper end of each first rectifying plate 41. The first rectifying plates 41 and the second rectifying plates 42 intersect each other at a lower portion of the air passage 44.

Figure 11:
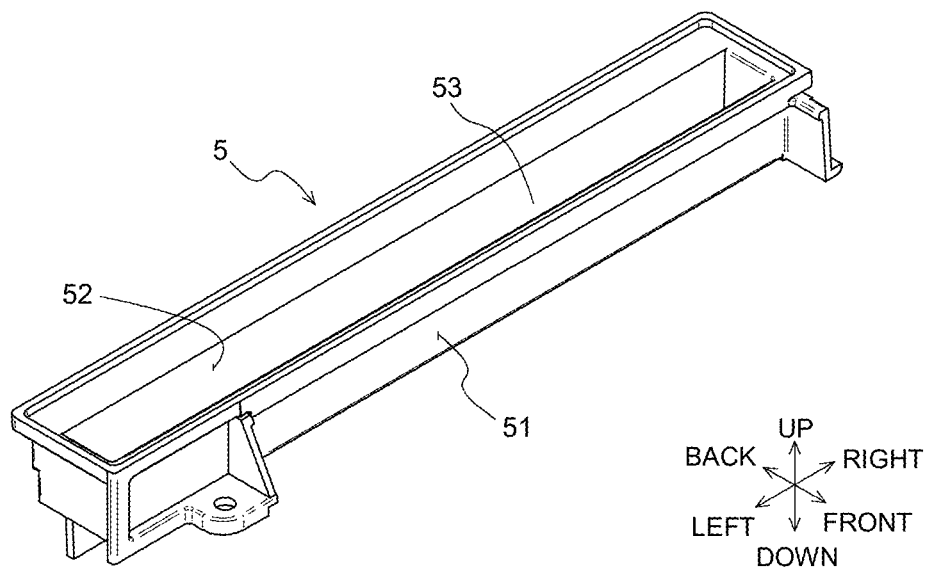
FIG. 11 is a perspective view of an upper side of a second air guide 5 according to Embodiment 1.
Figure 12:
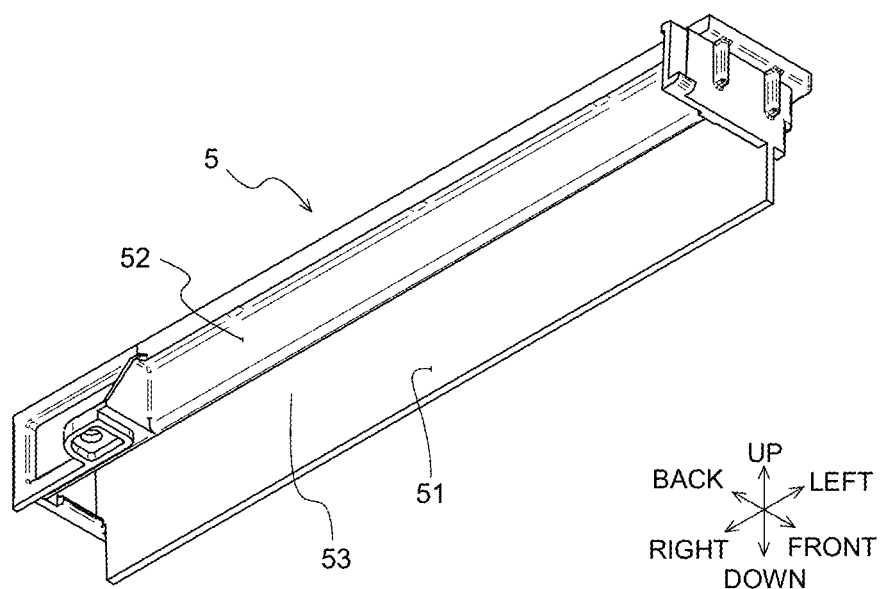
FIG. 12 is a perspective view of a lower side of the second air guide 5 according to Embodiment 1.

FIG. 11 is a perspective view of an upper side of the second air guide 5 according to Embodiment 1. FIG. 12 is a perspective view of a lower side of the second air guide 5 according to Embodiment 1. The second air guide 5 has the form of a substantially rectangular frame that is a through frame in the up and down direction, and a front plate and a back plate that form the rectangular frame correspond to a first air guide plate 51 and a second air guide plate 52. The inside of the second air guide 5 is called an air passage 53. The first air guide plate 51 and the second air guide plate 52 are disposed so that their flat surfaces extend in the left and right direction, and rectify a turbulence in the front and back direction of an air flow that flows between the first air guide plate 51 and the second air guide plate 52.

Figure 13:
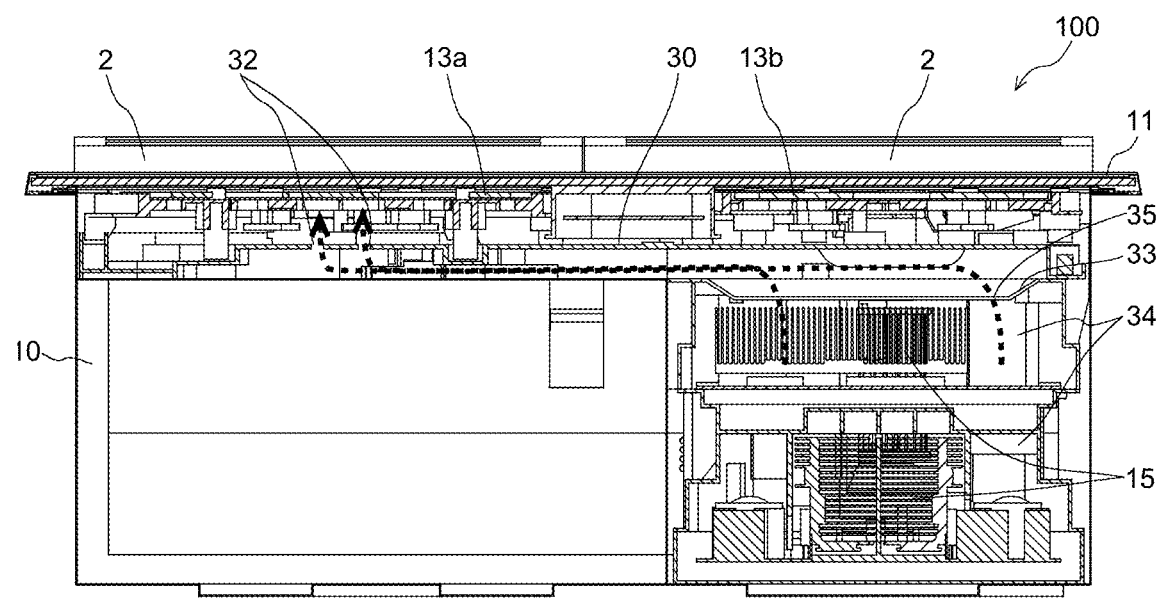
FIG. 13 is a front sectional view of the heating cooker 100 according to Embodiment 1.

FIG. 13 is a front sectional view of the heating cooker 100 according to Embodiment 1. FIG. 13 schematically illustrates a section passing the second air outlets 32 and the air passage 34. A dashed arrow conceptually indicates an air flow in FIG. 13 and in subsequent figures. The air passage 34 of the second cooling air guide 33 communicates with a lower side of the first cooling air guide 30 disposed below the heating coils 13a and 13b.

Figure 14:
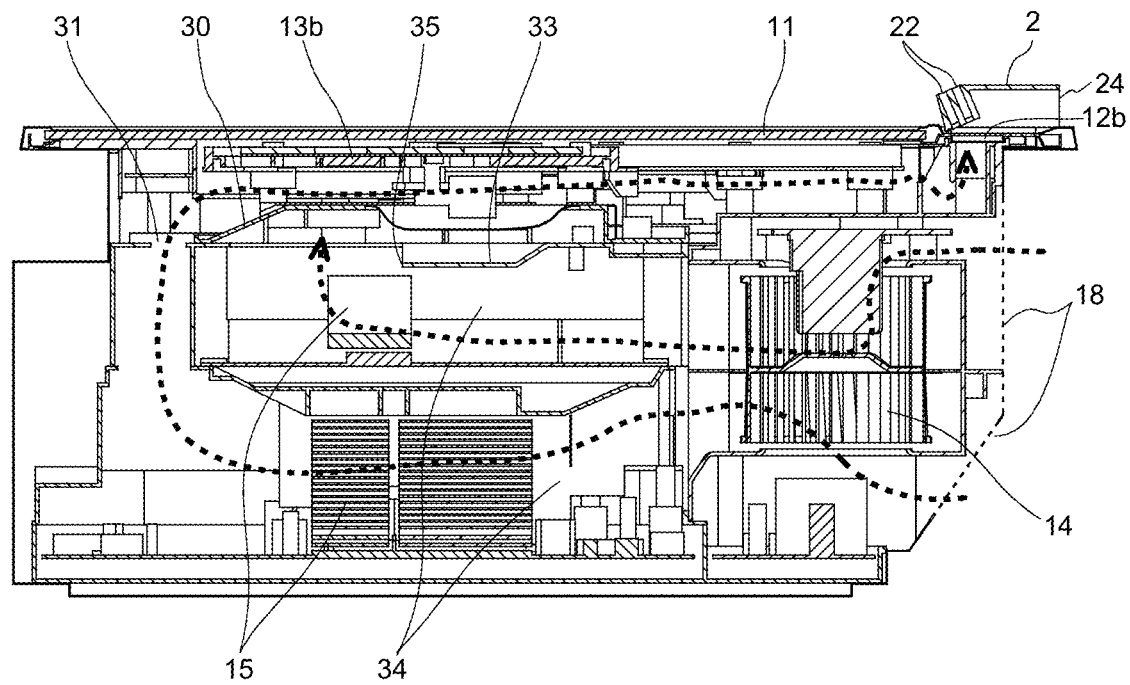
FIG. 14 is a side sectional view of the heating cooker 100 according to Embodiment 1.

FIG. 14 is a side sectional view of the heating cooker 100 according to Embodiment 1. FIG. 14 schematically shows a section that passes the air-sending device 14 and the first air outlets 31, and the left side of the drawing sheet is a front side. A plurality of air inlet ports 18 are formed in a back wall of the housing 10. The air inlet ports 18 and air inlets of the air-sending device 14 communicate with each other, and air outside the housing 10 is sucked into the air-sending device 14 via the air inlet ports 18.

Figure 15:
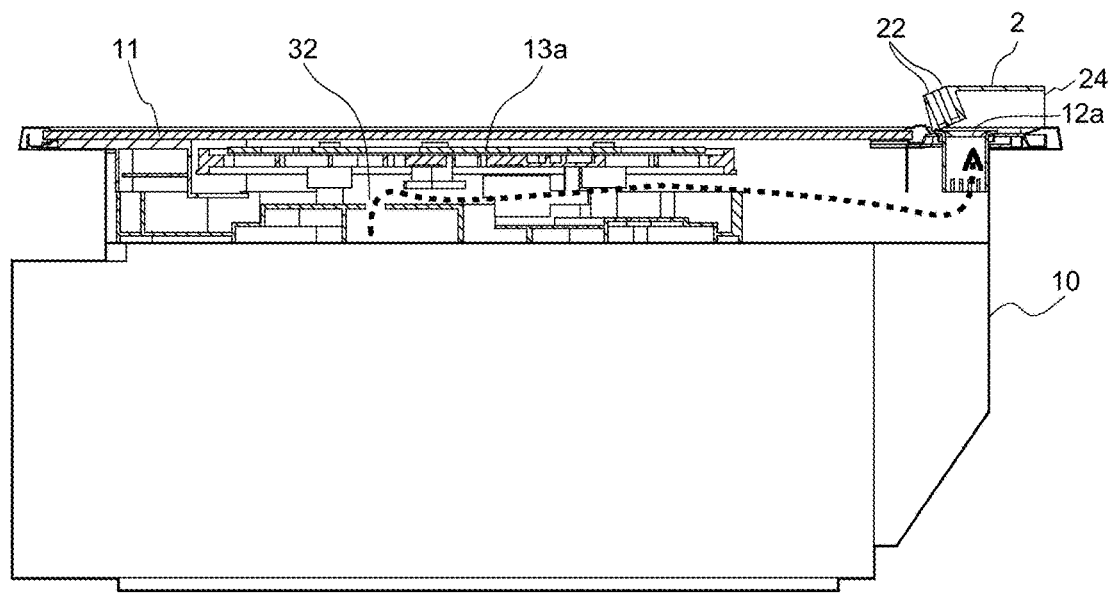
FIG. 15 is a side sectional view of the heating cooker 100 according to Embodiment 1.

FIG. 15 is a side sectional view of the heating cooker 100 according to Embodiment 1. FIG. 15 schematically shows a section that passes the heating coil 13a and the second air outlets 32, and the left side of the drawing sheet is a front side.

Referring to FIGS. 13 to 15, a general flow of cooling air is described. When the air-sending device 14 operates, as shown in FIG. 14, air is sucked into the air-sending device 14 via the air inlet ports 18, and the sucked air is sent out as cooling air. The cooling air sent out from the air-sending device 14 cools the driving device 15 accommodated in the air passage 34, while passing through the air passage 34 formed in the second cooling air guide 33. A part of the cooling air that has flowed through the air passage 34 flows into a location below the heating coil 13b via the first air outlets 31. The cooling air that has flowed into the location below the heating coil 13b flows toward the exhaust aperture 12b disposed behind the heating coil 13b while cooling the heating coil 13b, flows out from the exhaust aperture 12b, is guided to the exhaust air guide 2, and flows out from the heating cooker 100.

As shown in FIG. 13, a remaining part of the cooling air that has flowed through the air passage 34 flows into a location below the first cooling air guide 30 via the air outlet 35, flows toward the plurality of left second air outlets 32, and flows into a location below the heating coil 13a via the second air outlets 32. As shown in FIG. 15, the cooling air that has flowed into the location below the heating coil 13a flows toward the exhaust aperture 12a disposed behind the heating coil 13a while cooling the heating coil 13a, exits from the exhaust aperture 12a, is guided to the exhaust air guide 2, and flows out the heating cooker 100.

Next, detailed structures of the exhaust air guides 2, the first air guide 4, and the second air guide 5 are described. In Embodiment 1, although the two exhaust air guides 2 that are placed over the respective exhaust apertures 12a and 12b have the same structure, for convenience of the drawings, the structure of the exhaust air guides 2 is described in separate figures, that is, FIGS. 16 and 17.

Figure 16:
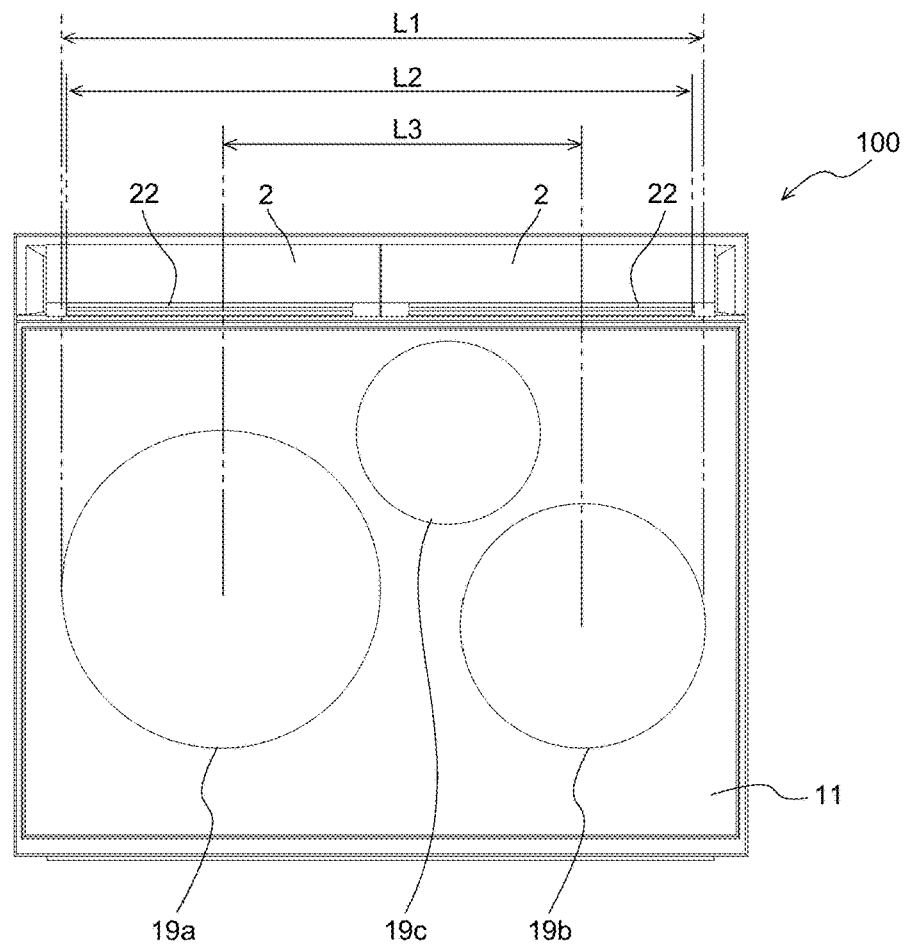
FIG. 16 is a plan view of the heating cooker 100 according to Embodiment 1.

FIG. 16 is a plan view of the heating cooker 100 according to Embodiment 1. Referring to FIG. 16, the dimensional relationship between the heating zones 19a to 19c and the first outlets 22 of the exhaust air guides 2 are described. L1 is the distance between both ends in the left and right direction of an area including the heating zones 19a to 19c, and, in Embodiment 1 in which the heating zone 19a is provided on a left end and the heating zone 19b is provided on a right end, L1 is the distance between the left end of the heating zone 19a and the right end of the heating zone 19b. L2 is the distance between both ends in the left and right direction of an area extending from one pair of first outlets 22 to the other pair of first outlets 22, and, in Embodiment 1 in which two exhaust air guides 2 are provided, L2 is the distance between left ends of the first outlets 22 of the left exhaust air guide 2 and right ends of the first outlets 22 of the right exhaust air guide 2. L3 is the distance between a center of the left-end heating zone 19a in a width direction and a center of the right-end heating zone 19b in the width direction.

The relationship of L1, L2, and L3 is L1>L2>L3. That is, in the left and right direction of the heating cooker 100, the first outlets 22 of the exhaust air guides 2 are disposed between both the left and right ends of the area including the heating zone 19a to the heating zone 19c (L1>L2). In this way, by disposing the first outlets 22 through which an air flow flows within the area including the heating zone 19a to the heating zone 19c in the width direction, a guiding air flow that has flowed out from the first outlets 22 and that has directed steam or smoke hardly flows to an outer side of the hood of the ventilator 201 in the left and right direction. Therefore, an oil or an offensive smell component included in the steam or the smoke can be suppressed from being diffused into a room.

A left end portion of each first outlet 22 of one exhaust air guide 2 is situated on an outer side relative to a center of the left heating zone 19a in the left and right direction, and a right end portion of each first outlet 22 of the other exhaust air guide 2 is situated on an outer side relative to a center of the right heating zone 19b in the left and right direction (L2>L3). In other words, the centers in the left and right direction of the area including the heating zone 19a to the heating zone 19c are provided between the left ends of the corresponding first outlets 22 and the right ends of the corresponding other first outlets 22. Therefore, cooking containers that are placed on the heating zones 19a to 19c and the first outlets 22 are generally opposite to each other in the front and back direction. Consequently, an air flow from the first outlets 22 easily guides steam or smoke from the cooking containers that are placed on the heating zones 19a to 19c, and can increase the effect of collecting steam or smoke by the ventilator 201.

Figure 17:
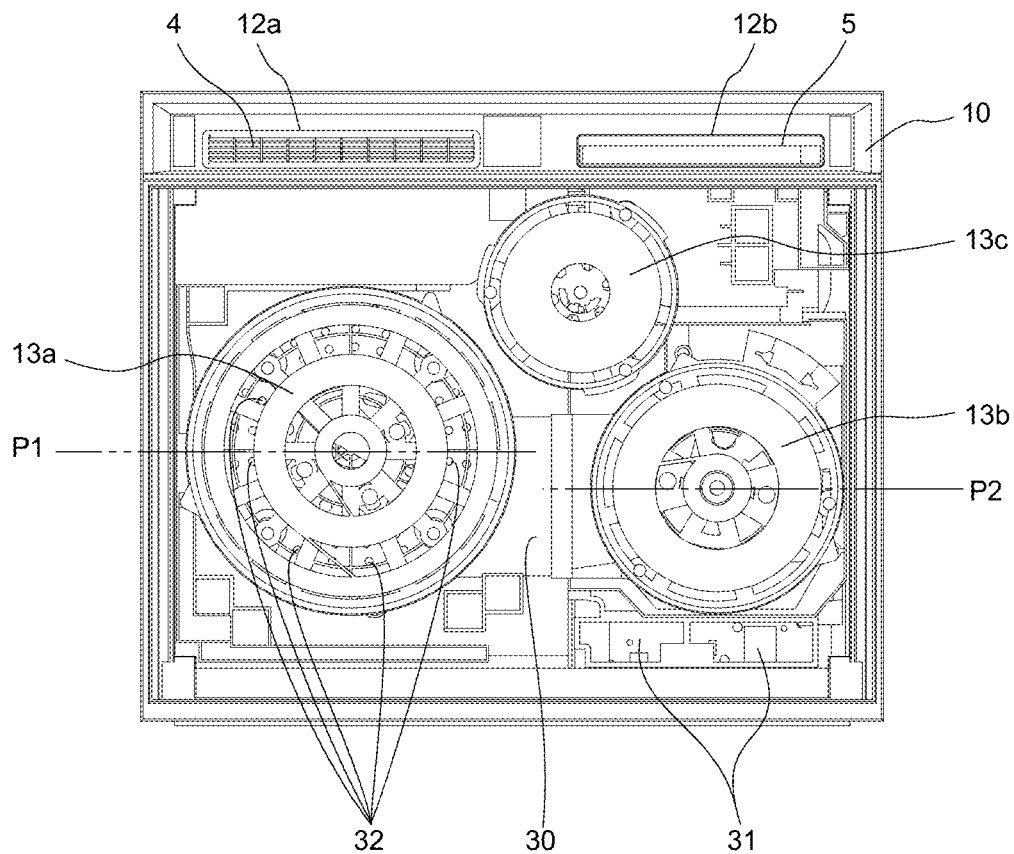
FIG. 17 is a plan view of the heating cooker 100 according to Embodiment 1 when the top plate 11 has been removed.

FIG. 17 is a plan view of the heating cooker 100 according to Embodiment 1 when the top plate 11 has been removed. The disposition of each component is described with reference to FIG. 17. Here, P1 denotes the position of a center in the front and back direction of the heating coil 13a disposed toward the front side, and P2 denotes the position of a center in the front and back direction of the heating coil 13b similarly disposed toward the front side.

Focusing on the left side of the heating cooker 100, in plan view, at least a part of the second air outlets 32 overlap the heating coil 13a in the front and back direction. In addition, similarly, in plan view, at least a part of the second air outlets 32 overlap the left exhaust aperture 12a in the front and back direction. The second air outlets 32, the heating coil 13a, and the left exhaust aperture 12a are provided linearly in the front and back direction. The plurality of second air outlets 32 of the first cooling air guide 30 are provided in the entire lower side of the heating coil 13a in a scattered manner in the left and right direction and the front and back direction. At least a part of the second air outlets 32 are provided on a front side of the center position P1 of the heating coil 13a. Cooling air that has been diffused from the plurality of second air outlets 32 and blown out to the lower side of the heating coil 13a can effectively cool the entire heating coil 13a. The cooling air that has cooled the heating coil 13a linearly flows toward the exhaust aperture 12a disposed behind the heating coil 13a. Therefore, the air flow that flows out from the first outlets 22 of the exhaust air guide 2 via the exhaust aperture 12a moves linearly upward and is hardly tilted in the left and right direction. Consequently, it is possible to increase the effect of guiding steam or smoke to the ventilator 201 from a cooking container by using the air flow from the first outlets 22.

Focusing on the right side of the heating cooker 100, in plan view, at least a part of the first air outlets 31 overlap the heating coil 13b in the front and back direction. In addition, similarly, in plan view, at least a part of the first air outlets 31 overlap the right exhaust aperture 12b in the front and back direction. The first air outlets 31, the heating coil 13b, and the right exhaust aperture 12b are provided linearly in the front and back direction. The plurality of first air outlets 31 of the first cooling air guide 30 are provided on a front side of the heating coil 13b. Therefore, the first air outlets 31 are provided on a front side of the center position P2 of the heating coil 13b. Cooling air that has been blown out to the lower side of the heating coil 13b from the first air outlets 31 cools the heating coil 13b and linearly flows toward the exhaust aperture 12b disposed behind the heating coil 13b. Therefore, the air flow that flows out from the first outlets 22 of the exhaust air guide 2 via the exhaust aperture 12a is hardly tilted in the left and right direction and hardly moves linearly. Consequently, it is possible to increase the effect of guiding steam or smoke to the ventilator 201 from a cooking container by using the air flow from the first outlets 22.

Figure 18:
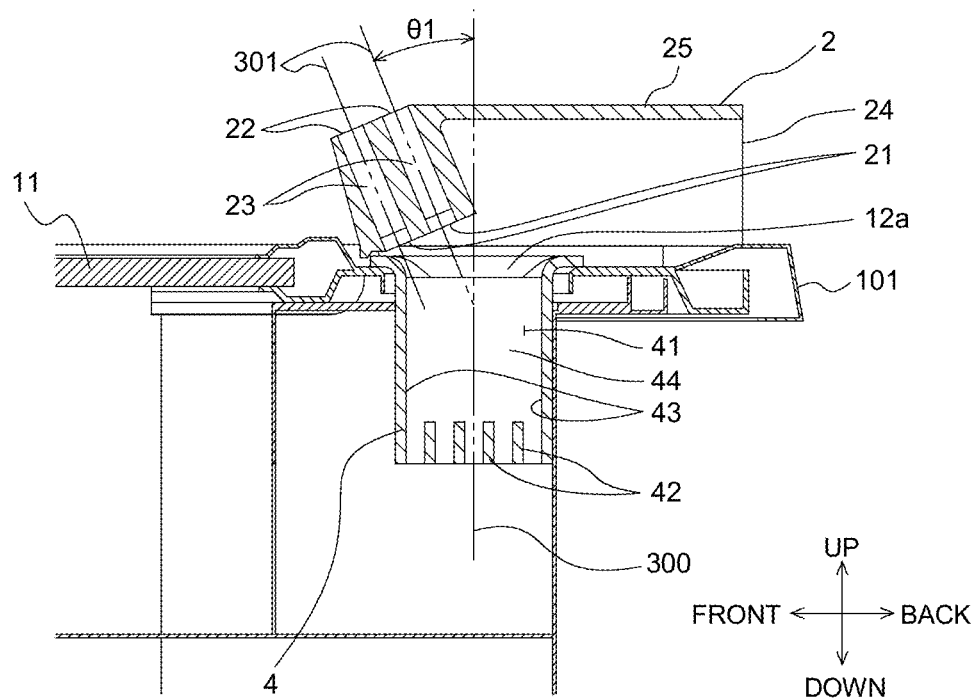
FIG. 18 is a partial sectional view of the vicinity of a left exhaust aperture 12a according to Embodiment 1.

FIG. 18 is a partial sectional view of the vicinity of the left exhaust aperture 12a according to Embodiment 1. A vertical line passing a center of the air passage 44 of the first air guide 4 in the front and back direction is indicated by a vertical line 300, and an axis of each air passage 23 of the exhaust air guide 2 is indicated by an axis 301. The axis 301 of each air passage 23 of the exhaust air guide 2 is tilted forward relative to the vertical line 300. By tilting the axis 301 of each air passage 23 forward, exhaust air that flows out from the first outlets 22 moves obliquely upward. Desirably, the axis 301 of each air passage 23 has a tilt angle θ1 in a range that is greater than 0 degrees and less than 35 degrees relative to the vertical line 300. More desirably, the tilt angle θ1 is 8 degrees to 32 degrees.

The first inlets 21 of the exhaust air guide 2 are provided on a front side relative to the center of the air passage 44 in the front and back direction, that is, above ½ of the front side of the air passage 44. Desirably, when seen in plan perspective, the first inlets 21 and the first air guide 4 are provided so that ½ or more of an opening area of the first inlets 21 overlaps a region of ½ of the front side of the sectional area of the air passage 44. An air flow that has flowed into the air passage 44 of the first air guide 4 flows upward substantially vertically along an front-side inner surface of the outer frame 43 by the Coanda effect. The air flow that has been guided by the front-side inner surface of the outer frame 43 and that has flowed upward in this way easily flows into the first inlets 21.

In plan view, the exhaust air guide 2 and the first air guide 4 are disposed so that the first inlets 21 of the exhaust air guide 2 and at least a part of the first rectifying plates 41 and a part of the second rectifying plates 42 overlap each other in the up and down direction. By disposing the first rectifying plates 41 and the second rectifying plates 42, it is possible to reduce turbulence of the air flow from the first outlets 22 of the air passages 23.

The length of the air passage 44 of the first air guide 4 is greater than or equal to a length of a cross section of the air passage 44 in the front and back direction. By increasing the length of the air passage 44, it is possible to increase the effect of rectifying the air flow that passes through the air passage 44 by the first rectifying plates 41 and the second rectifying plates 42. Due to proper pressure loss that is generated by the first rectifying plates 41 and the second rectifying plates 42, each being disposed in the air passage 44, variations in the air speed distributions between air flows that flow through a forward portion and a rearward portion of the air passage 44 are reduced. By reducing the variations in the air speed distributions, it is possible to cause air flows having little turbulence to flow into the first inlets 21 of the exhaust air guide 2. Therefore, the turbulence of the air flows that flow out from the first outlets 22 via the air passages 23 is also reduced, and, after the air flows have flowed out from the first outlets 22, an air flow that is hardly diffused can be generated.

Figure 19:
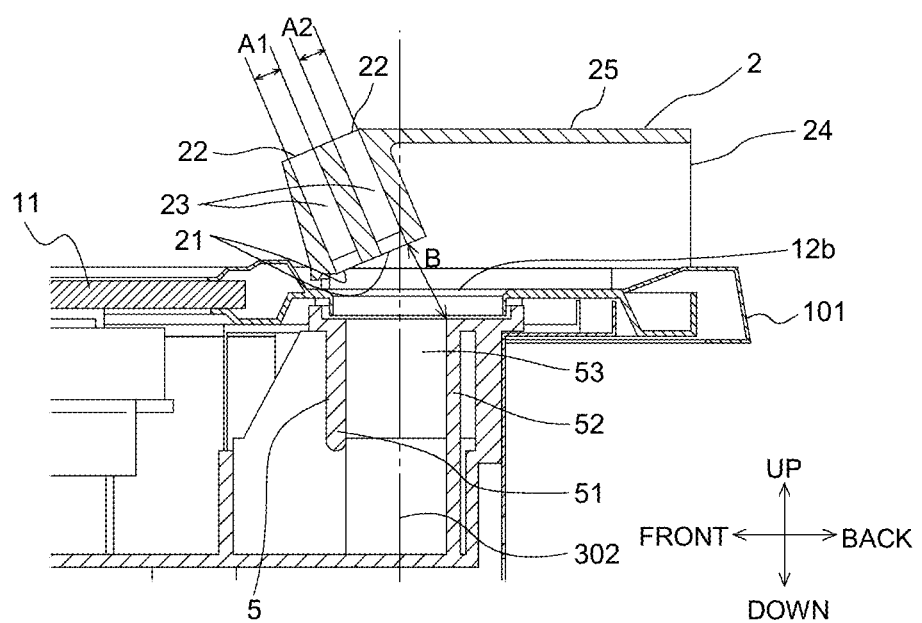
FIG. 19 is a partial sectional view of the vicinity of a right exhaust aperture 12b according to Embodiment 1.

FIG. 19 is a partial sectional view of the vicinity of the right exhaust aperture 12b according to Embodiment 1. A vertical line passing through a center of the air passage 53 of the second air guide 5 in the front and back direction is indicated by a vertical line 302. That a center line extending in an axial direction of each air passage 23 of the exhaust air guide 2 is tilted forward relative to the vertical line is as illustrated in FIG. 18. That the first inlets 21 of the exhaust air guide 2 are disposed on a front side relative to a center in the front and back direction of the air passage 53 inside the second air guide 5, that is, above ½ of a front portion of the inside of the air passage 53 is as illustrated in FIG. 18.

In FIG. 19, lengths of flow-passage cross sections of two air passages 23 in the front and back direction are denoted by A1 and A2, respectively. In Embodiment 1, A1 and A2 are the same. In addition, in Embodiment 1, since the shape of the flow-path cross section of each air passage 23 is the same from the first inlet 21 to the first outlet 22, A1 and A2 are equal to a length of its corresponding first inlet 21 in the front and back direction and a length of its corresponding first outlet 22 in the front and back direction.

An axial length of each air passage 23, that is, a length from the first inlet 21 to the first outlet 22 is longer than the length A1 in the front and back direction of an opening side of the first inlet 21 and the length A2 in the front and back direction of an opening side of the first outlet 22. Therefore, the effect of rectifying in the front and back direction an air flow that flows through each air passage 23 is increased, and the directivity of the air flow that flows out from each first outlet 22 can be improved.

In FIG. 19, a length between an upper end of the second air guide plate 52 of the second air guide 5 and the first inlet 21 closest to the back side of the plurality of first inlets 21 is denoted by B. The total of the lengths of A1 and A2 (A1+A2) is a value that is 1 to 2 times greater the length B. By using such a dimensional relationship, it is possible to suppress a reduction in the air speed of the air flow that flows into each first inlet 21. Therefore, a reduction in the air speed of the air flow that flows out from each first outlet 22 is also suppressed.

Figure 20:
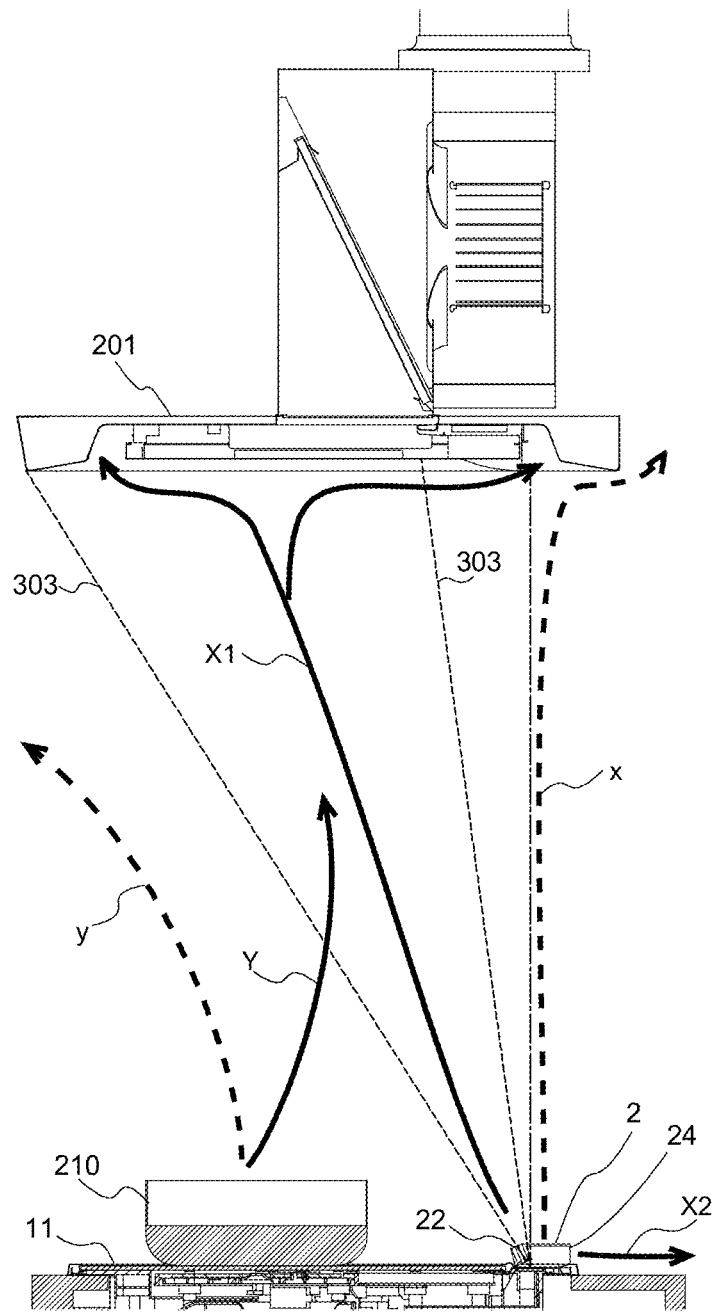
FIG. 20 illustrates an action when the heating cooker 100 according to Embodiment 1 is disposed in an island kitchen.

FIG. 20 illustrates an action when the heating cooker 100 according to Embodiment 1 is disposed in an island kitchen. A solid arrow X1 and a solid arrow X2 in FIG. 20 conceptually denote an air flow from the heating cooker 100, and a solid arrow Y conceptually denotes steam or smoke from a cooking container 210. A broken arrow x conceptually denotes an example of an air flow from an exhaust aperture provided in an upper side of a related-art heating cooker, and a broken arrow y conceptually denotes an example of steam or smoke from a cooking container placed on the related-art heating cooker.

First, an action of the related-art heating cooker is described. In the case of the example of the related art, the air flow x from the heating cooker moves upward while mixing with steam or smoke that is generated from the cooking container. When a kitchen wall does not exist behind the heating cooker as in an island kitchen, the air flow x mixed with the stream or the smoke leaks toward the back from a back end of a hood of a ventilator 201 and easily flows out toward the living room or the dining room. Since many general ventilators 201 are such that their suck-in position is situated toward a front side of the hood, the air flow x easily leaks toward the back from the back end of the hood of the ventilator 201. Further, for wall-mounted kitchens, many of the kitchens being of this type, considering that great importance is attached to suction from a location near the front side of the ventilator 201, general ventilators 201 are often designed so that the suction force on the front side is larger than the suction force on the back side. Therefore, when the ventilator 201 designed in such a way and an island kitchen are combined, leakage of the air flow x from the related-art heating cooker is noticeable. Further, the air flow x that moves from an upper surface of the heating cooker to a location directly above the upper surface has a low directing effect of steam or smoke y, and the steam or the smoke y tends to leak and to be diffused toward a user.

According to Embodiment 1, centers in the front and back direction of the first outlets 22 of the air passages 23 of each exhaust air guide 2 are positioned on a front side relative to centers in the front and back direction of the first inlets 21 of the air passages 23. Due to this structure, the axes 301 of the air passages 23 are tilted to rise upward toward the first outlets 22 from the first inlets 21. Therefore, the air flow X1 from the first outlets 22 is blown out obliquely upward. Consequently, the air flow X1 is turned to be a guiding air flow, and steam or smoke Y that is generated from the cooking container 210 placed on the heating zone on the front side relative to each exhaust air guide 2 can be guided to the ventilator 201 that is disposed to cover the heating cooker 100 from above. As described above, in general, the ventilator 201 is designed so that the depth dimension of the hood of the ventilator 201 is greater than or equal to the depth dimension of the heating cooker 100. Therefore, when the air flow that moves obliquely upward from the first outlets 22 disposed in the back portion of the heating cooker 100 guides the steam or the smoke Y, it is also possible to suck in the steam or the smoke from the front side of the hood of the ventilator 201.

The axes 301 of the air passages 23 of each exhaust air guide 2 of Embodiment 1 (see FIG. 18) are tilted forward relative to the vertical line 300 in a range that is greater than 0 degrees and less than or equal to 35 degrees (see FIG. 18). More desirably, a forwardly-tilt angle of the axes 301 of the air passages 23 relative to the vertical line 300 is 8 degrees to 32 degrees. The range of the tilt angle of 8 degrees to 32 degrees is indicated by two broken lines 303 in FIG. 20. By setting the tilt angles of the air passages 23 in this way, it is possible to cause the air flow X1 to flow out toward the hood of the ventilator 201 that is disposed to cover the heating cooker 100 from above. Therefore, the air flow X1 easily acts as a guiding air flow.

Each exhaust air guide 2 according to Embodiment 1 has the second outlet 24 behind the first outlets 22. The exhaust air guides 2 are configured to cause air flows that have flowed out from the respective exhaust apertures 12a and 12b to branch and flow into the first outlets 22 and the second outlet 24. Of exhaust air separated by each exhaust air guide 2, a part of the exhaust air flows out from the first outlets 22 as the air flow X1 and the other part of the exhaust air flows out from the second outlet 24 as the air flow X2. The air volumes of the air flows X that have branched off from the respective air flows from the respective exhaust apertures 12a and 12b are relatively reduced. By preventing the air volumes of the air flows X1 from becoming too large, it is possible to increase the action of the air flows X1 as guiding air flows that guide steam or smoke to the ventilator 201. It is also possible to use a structure that does not include the second outlets 24 and that discharges exhaust air only from the first outlets 22. For example, when a cooling load inside the housing 10 is relatively small and the air volume of the air-sending device 14 is also small, since the air volumes of the air flows X1 from the first outlets 22 are also reduced, it is possible to cause the air flows X1 to act as guiding air flows.

Figure 21:
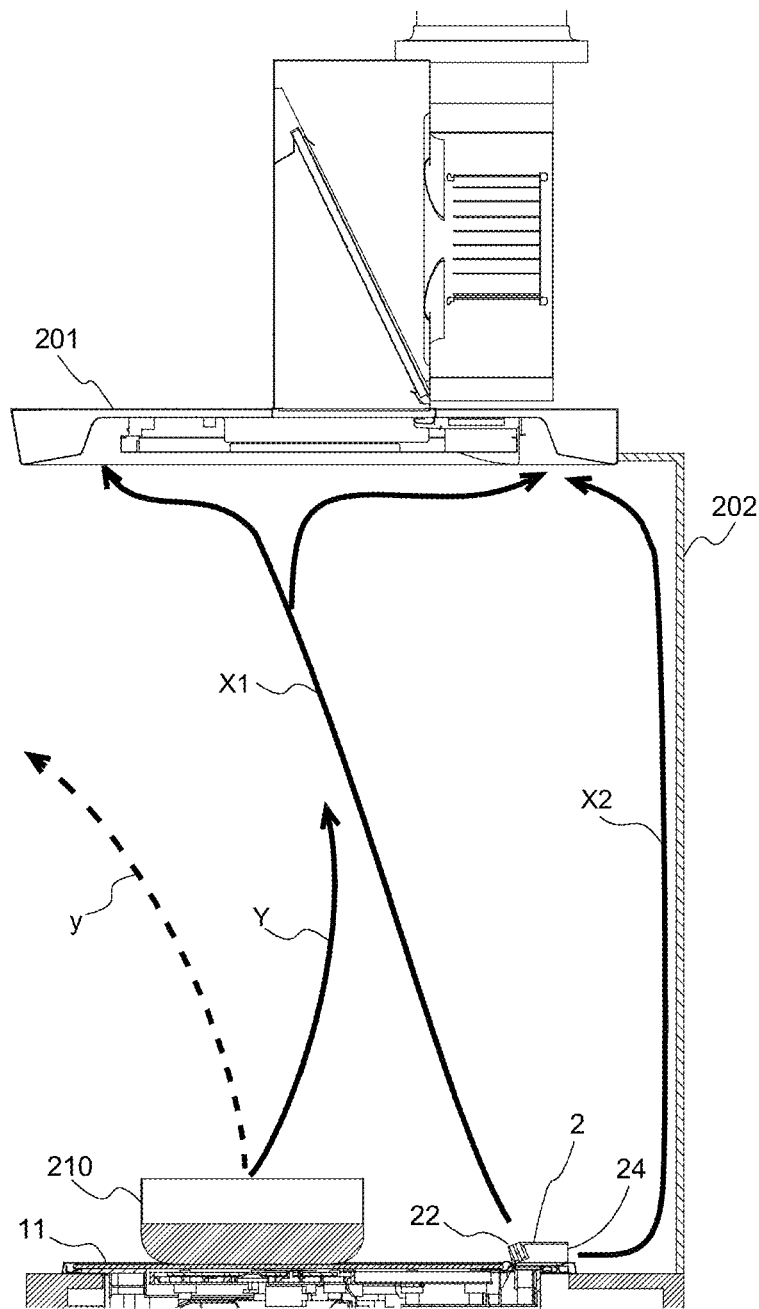
FIG. 21 illustrates an action when the heating cooker 100 according to Embodiment 1 is disposed in a wall-mounted kitchen.

FIG. 21 illustrates an action when the heating cooker 100 according to Embodiment 1 is disposed in a wall-mounted kitchen. According to Embodiment 1, the air flows X1 from the first outlets 22 are blown out obliquely upward. Therefore, the air flows X1 is turned to be guiding air flows, and the steam or the smoke Y that is generated from the cooking containers 210 placed on the heating zones on the front side relative to the exhaust air guides 2 can be guided to the ventilator 201 disposed above. Since the air flows X1 move obliquely upward, contact with the kitchen wall 202 of the air flows X1 mixed with the steam or the smoke Y is reduced. Therefore, an oil or an offensive smell component included in the steam or the smoke Y can be suppressed from soiling the kitchen wall 202.

In Embodiment 1, the exhaust air guides 2 are configured to cause the air flows that have flowed out from the respective exhaust apertures 12a and 12b to branch and flow into the first outlets 22 and the second outlet 24. Each air flow X2 flows out rearward from the second outlet 24 of its corresponding exhaust air guide 2. Each air flow X2 that is discharged rearward of the heating cooker 100 is basically clean air that is not mixed with the oil or the offensive smell component included in the steam or the smoke Y. The air flows X2 act as air curtains for the kitchen wall 202 by flowing upward along the kitchen wall 202. Therefore, the kitchen wall 202 is prevented from being soiled.

In Embodiment 1, when the air-sending device 14 operates, the air speed of each air flow X2 that flows out from its corresponding second outlet 24 is lower than the air speed of each air flow X1 that flows out from the corresponding first outlets 22. When the air speed of each air flow X2 is higher than the air speed of each air flow X1, the air flows X1 that should act as guiding air flows are pulled toward the air flows X2 that flow rearward, and hardly act as guiding air flows. However, when the air speeds of the air flows X1 from the first outlets 22 are higher than the air speeds of the air flows X2 from the second outlets 24, the air flows X1 act as guiding air flows without being directed to the air flows X2. Here, each air flow X1 from the first outlets 22 may have an average air speed of 0.8 [m/s] to 2.4 [m/s] and an air volume of 0.14 [m$^3$/s] to 0.7 [m$^3$/s]. When the air flows X1 have such air speeds and air volumes, it is possible to increase the effect of suppressing the steam or the smoke Y that is generated from the cooking containers 210 from diffusing while rising. The air speeds and the air volumes of the air flows X1 may be within a range that does not exceed suction air volume and air speed provided by the ventilator 201. This makes it possible to suppress the steam or the smoke Y that is generated from the cooking containers 210 from leaking without being sucked into the ventilator 201.

Figure 22:
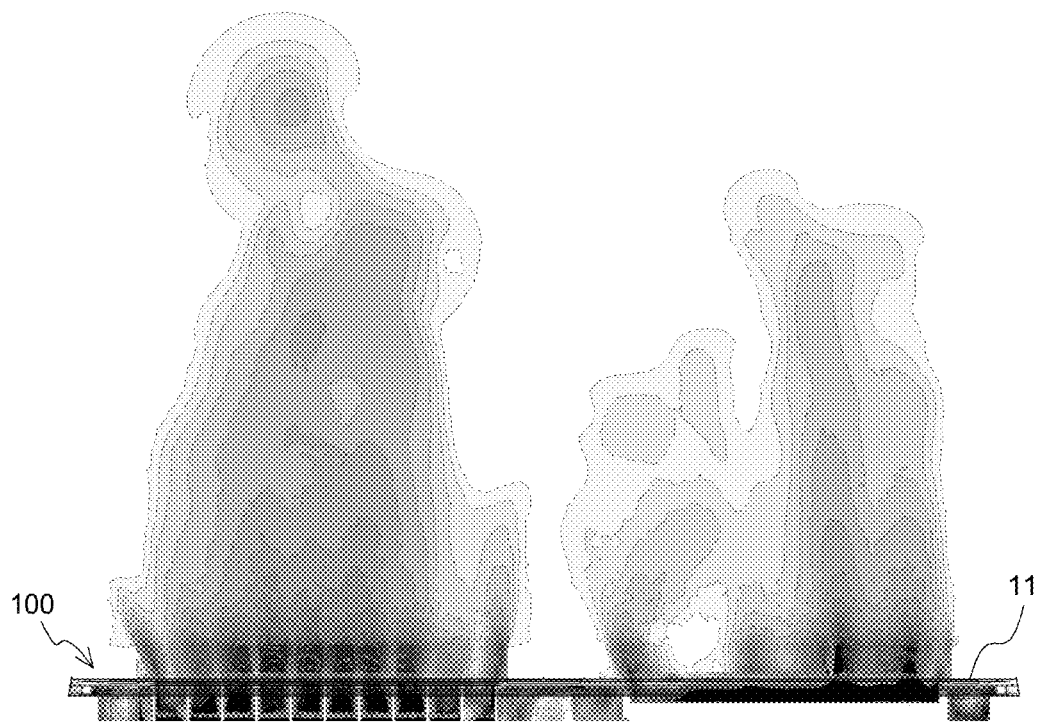
FIG. 22 illustrates, by using isothermal lines, an action when water is boiled by the heating cooker 100 according to Embodiment 1.
Figure 23:
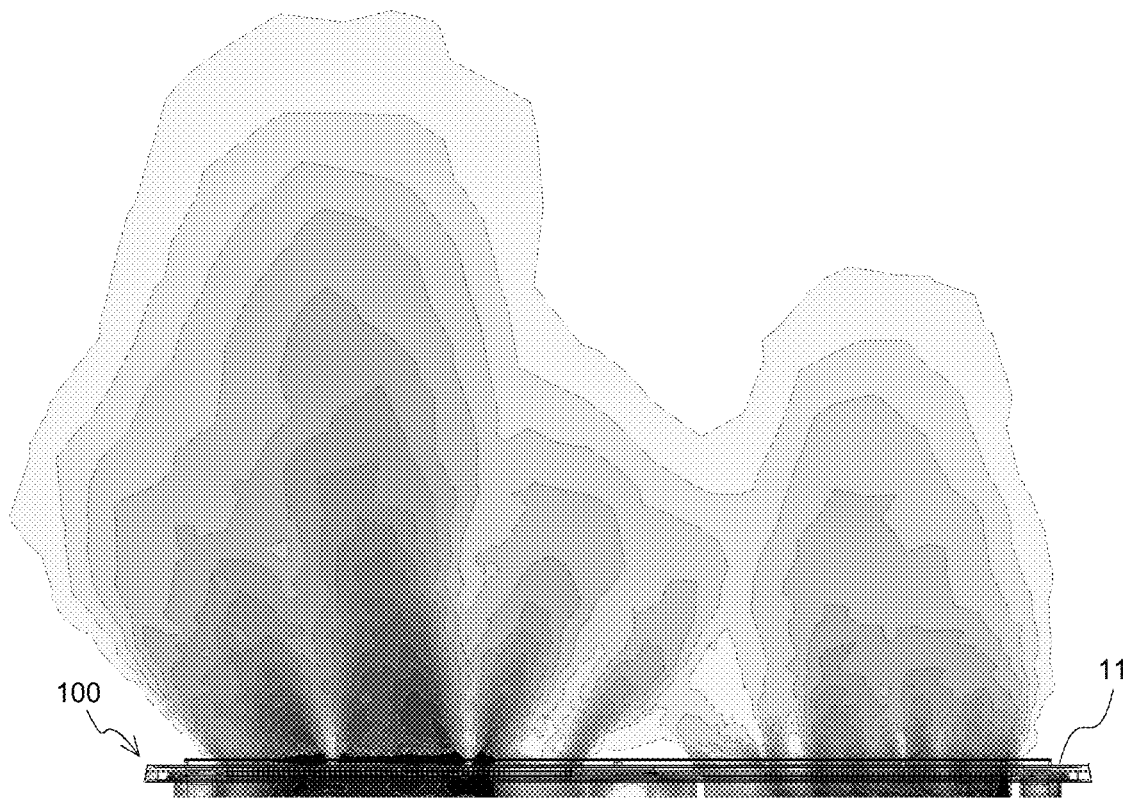
FIG. 23 illustrates, by using isothermal lines, an action when water is boiled by a heating cooker according to a comparative example.

FIG. 22 illustrates, by using isothermal lines, an action when water is boiled by the heating cooker 100 according to Embodiment 1. FIG. 23 illustrates, by using isothermal lines, an action when water is boiled by a heating cooker according to a comparative example. FIGS. 22 and 23 illustrate states of the heating cookers 100 in plan view. FIG. 23 illustrates the heating cooker of a form in which exhaust air flows out from the upper side of the heating cooker to a location directly above the upper side as indicated as one example of the related art in FIGS. 20 and 21. As shown in FIG. 22, according to Embodiment 1, since the tilt in the left and right direction of the guiding air flows from the first outlets 22 is small and the air flows having high straightness are blown out, the guiding air flows and the steam or the smoke guided by the guiding air flows are almost never diffused in the left and right direction. On the other hand, in the comparative example shown in FIG. 23, the guiding air flows and the steam or the smoke guided by the guiding air flows spread in the left and right direction than those in FIG. 22.

Focusing on the variations of the forms of the isothermal lines on the left side and the right side, FIG. 23 illustrating the comparative example shows a state in which the form of the isothermal lines on the left side and the form of the isothermal lines on the right side differ greatly. Specifically, the area surrounded by the outermost isothermal line on the left side is wider than the area surrounded by the outermost isothermal line on the right side. In FIG. 23 illustrating the comparative example, the amount of air flow flowing out from the left exhaust aperture is larger than the amount of air flow flowing out from the right exhaust aperture. When the amounts of air flows that flow out from the exhaust apertures on the left and right sides are poorly balanced in this way, the guiding effects by the guiding air flows when the cooking containers on the respective left and right heating zones are heated are hardly realized. This is because, of the left and right guiding air flows, the air flow having a smaller air volume and air speed is directed to the air flow having a larger air volume and air speed, and the air flow having the smaller air volume and air speed hardly acts as the guiding air flow. On the other hand, in FIG. 22 illustrating Embodiment 1, the right isothermal lines and the left isothermal lines are relatively well balanced on the left and right sides. Therefore, according to Embodiment 1, with regard to the cooking container placed on either one of the left and right heating zones, the steam or the smoke from the cooking container can be guided to the ventilator.

Here, one cause of the poor balance on the left and right sides between the air flows that flow out from the exhaust apertures in the comparative example is that only one air-sending device is disposed on the right side. Due to the structures of the air passages inside the housing, cooling air from the air-sending device disposed on the right side easily flows toward the left exhaust aperture by a large amount. Therefore, a large amount of air flow flows out from the left exhaust aperture. That only one air-sending device 14 is disposed at the right side of the housing 10 is the same in Embodiment 1. However, by using the following structure, the air volume and the air speed of the air flow that flows out from the left exhaust aperture 12a and the air volume and the air speed of the air flow that flows out from the right exhaust aperture 12b are balanced.

Specifically, as shown in FIG. 17, pressure loss of the air flow that passes through the first air guide 4 disposed in the left exhaust aperture 12a and pressure loss of the air flow that passes through the second air guide 5 disposed in the right exhaust aperture 12b are caused to differ from each other. As shown in FIGS. 9 and 10, the first air guide 4 includes the plurality of first rectifying plates 41 and the plurality of second rectifying plates 42 in the air passage 44 and these cause pressure loss. On the other hand, as shown in FIGS. 11 and 12, the second air guide 5 does not include rectifying plates inside the air passage 53. In this way, by causing the pressure loss inside the air passage 44 of the first air guide 4 to be relatively large, the air volume of the air flow from the left exhaust aperture 12a where the first air guide 4 is disposed is reduced. Therefore, the air volume of the air flow that flows out of the left exhaust aperture 12a and the air volume of the air flow that flows out of the right exhaust aperture 12a can be balanced.

As described above, the heating cooker 100 of Embodiment 1 includes the housing 10 that have the exhaust apertures 12a and 12b formed on the upper surface thereof, and the top plate 11 that is provided with the heating zones 19a, 19b, and 19c disposed, in plan view, on the front side relative to the exhaust apertures 12a and 12b. The heating coils 13a, 13b, and 13c that perform induction heating to heat heating targets placed on the heating zones 19a, 19b, and 19c, and the air-sending device 14 are disposed inside the housing 10. Further, the heating cooker 100 includes the first cooling air guide 30 that has the first air outlets 31 and the second air outlets 32 and that guide the air flow from the air-sending device 14 to the first air outlets 31 and the second air outlets 32. The heating cooker 100 also includes the exhaust air guides 2 that are disposed over the respective exhaust apertures 12a and 12b and that are formed with the air passages 23 extending from the respective first inlets 21 to the respective first outlets 22. In plan view, the first air outlets 31 and the second air outlets 32 of the first cooling air guide 30 and the exhaust apertures 12a and 12b are aligned with each other in the front and back direction. In plan view, the first air outlets 31 and the second air outlets 32 of the first cooling air guide 30 and the heating coils 13a and 13b are aligned with each other in the front and back direction. In plan view, the first air outlets 31 and the second air outlets 32 of the first cooling air guide 30 are disposed on the front side relative to the centers of the heating coils 13a and 13b. The air passages 23 of the exhaust air guides 2 have longer lengths than the lengths of the first outlets 22 of the air passages 23 in the front and back direction.

According to the heating cooker 100 of Embodiment 1, the air flows flowing to the exhaust apertures 12a and 12b from the first air outlets 31 and the second air outlets 32 can be suppressed from tilting in the left and right direction. Therefore, the air flows that exit from the exhaust apertures 12a and 12b and flow out via the exhaust air guides 2 travel in a more straight line, and it is possible to increase the action of guiding the steam or the smoke to the ventilator 201 by using the air flows from the exhaust air guides 2. The first air outlets 31 and the second air outlets 32 are disposed on the front side of the centers of the heating coils 13a and 13b, and distance to the exhaust apertures 12a and 12b from the first air outlets 31 and the second air outlets 32 is ensured. Therefore, tilting of the air flows in the left and right direction is suppressed by the time the air flows reach the exhaust apertures 12a and 12b, and the effect of rectifying the tilted air flows to straight air flows is high. Since the air passages 23 of the exhaust air guides 2 have lengths longer than the lengths of the first outlets 22 of the air passages 23 in the front and back direction, the effect of rectifying in the front and back direction the air flows passing through the air passages 23 is increased, and the directivity of the guiding air flows that flow out from the first outlets 22 can be improved. By increasing the directivity of the guiding air flows, it is possible to increase the action of guiding the directed steam or smoke to the ventilator 201.

Embodiment 2

Figure 24:
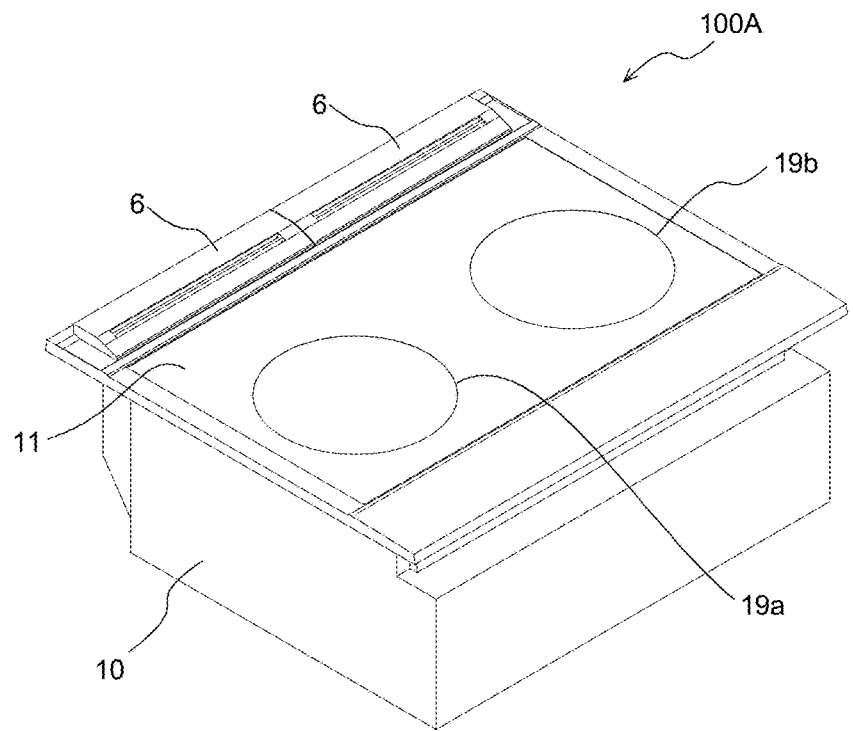
FIG. 24 is a perspective view of a heating cooker 100A according to Embodiment 2.

Embodiment 2 is described while focusing on the differences from Embodiment 1. FIG. 24 is a perspective view of a heating cooker 100A according to Embodiment 2. The heating cooker 100A is provided with two heating zones 19a and 19b. In Embodiment 2, exhaust air guides 6 having forms that differ from those of the exhaust air guides 2 of Embodiment 1 are provided.

Figure 25:
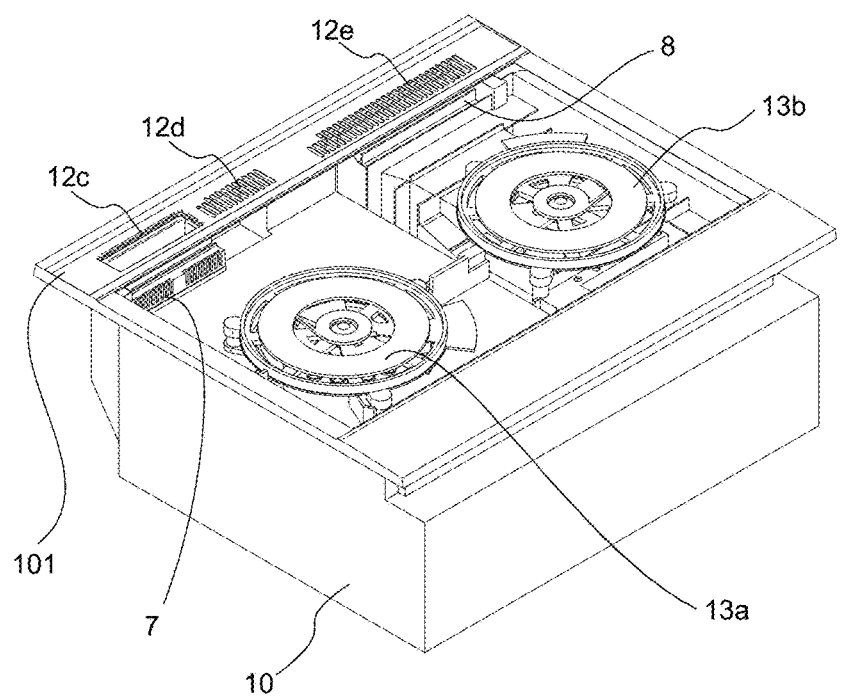
FIG. 25 is a perspective view of the heating cooker 100A according to Embodiment 2 when a top plate 11 thereof has been removed.

FIG. 25 is a perspective view of the heating cooker 100A according to Embodiment 2 when a top plate 11 thereof has been removed. Heating coils 13a and 13b are disposed inside a housing 10 at positions that depend upon the positions of the heating zones 19a and 19b shown in FIG. 24. Three exhaust apertures 12c to 12e are provided side by side on the left and right in the housing 10 and behind the heating coils 13a and 13b. In Embodiment 2, the exhaust aperture 12c has one opening. The exhaust aperture 12d and 12e each have a plurality of openings that are long in a front and back direction.

A third air guide 7 that guides an air flow toward the exhaust aperture 12c from the inside of the housing 10 is disposed below the exhaust aperture 12c inside the housing 10. A fourth air guide 8 that guides an air flow toward the exhaust aperture 12e from the inside of the housing 10 is disposed below the exhaust aperture 12e inside the housing 10.

Figure 26:
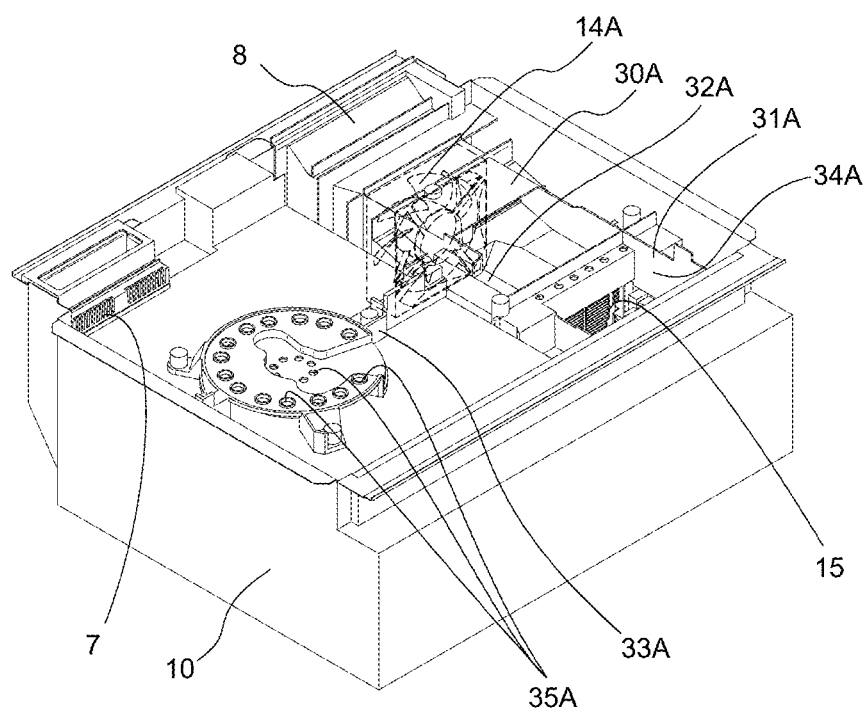
FIG. 26 is a perspective view illustrating an internal structure of the heating cooker 100A according to Embodiment 2.

FIG. 26 is a perspective view illustrating an internal structure of the heating cooker 100A according to Embodiment 2. FIG. 26 illustrates the internal structure when the heating coils 13a and 13b and an upper frame 101 have been removed from the state shown in FIG. 25. A first cooling air guide 30A is disposed inside the housing 10. The first cooling air guide 30A is provided for guiding cooling air sent out from an air-sending device 14A to a cooling target via a first air outlet 31A and a second air outlet 32A, the cooling target disposed inside the housing 10. In Embodiment 2, the air-sending device 14A is an axial fan. The air-sending device 14A is disposed so that an axis of the fan extends in the front and back direction.

The first cooling air guide 30A has the first air outlet 31A and the second air outlet 32A. The first cooling air guide 30A forms an air passage 34A in the inside, and guides cooling air from the air-sending device 14A to the first air outlet 31A and the second air outlet 32A. The first air outlet 31A has openings in upper and lower sides toward a front side of the inside of the housing 10. The second air outlet 32A is formed by a gap that is formed between an upper surface of the first cooling air guide 30A and a lower surface of the heating coil 13b (see FIG. 25) that is placed on the first cooling air guide 30A. The second air outlet 32A has openings in left and right sides. The air passage 34A is formed inside the first cooling air guide 30A. A driving device 15 is disposed in the air passage 34A.

An air guide plate 33A that is provided in a standing manner in an up and down direction and extends in the left and right direction is disposed between a downstream side of the second air outlet 32A and a lower side of the left heating coil 13a (see FIG. 25). A plurality of third air outlets 35A are provided at the left side of the air guide plate 33A. The third air outlets 35A are provided below the left heating coil 13a (see FIG. 26). A cooling-air flow passage reaching the third air outlets 35A from the first air outlet 31A and the second air outlet 32A is formed on a front side relative to the air guide plate 33A.

Figure 27:
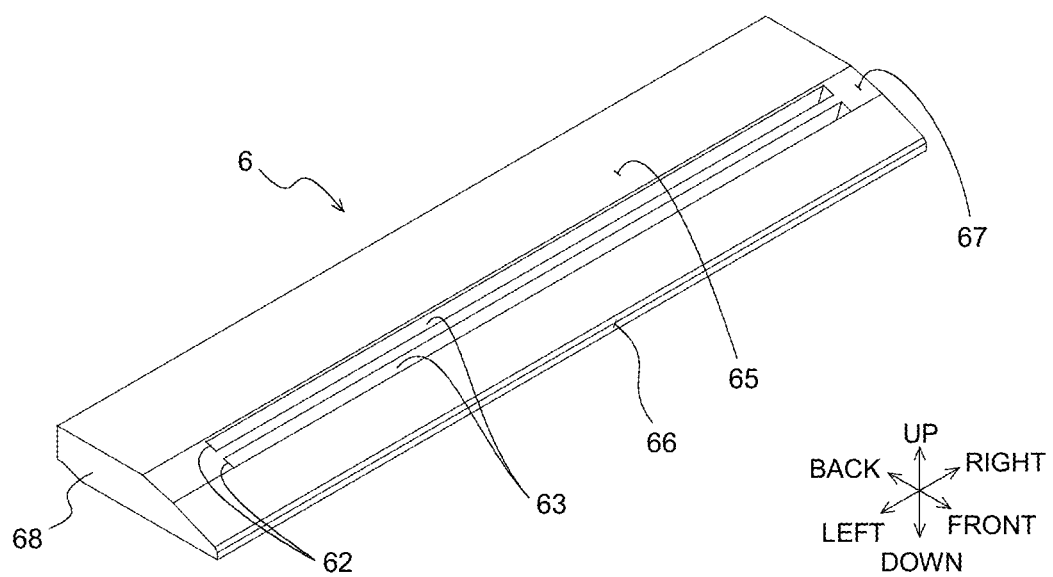
FIG. 27 is a perspective view of an upper side of an exhaust air guide 6 according to Embodiment 2.
Figure 28:
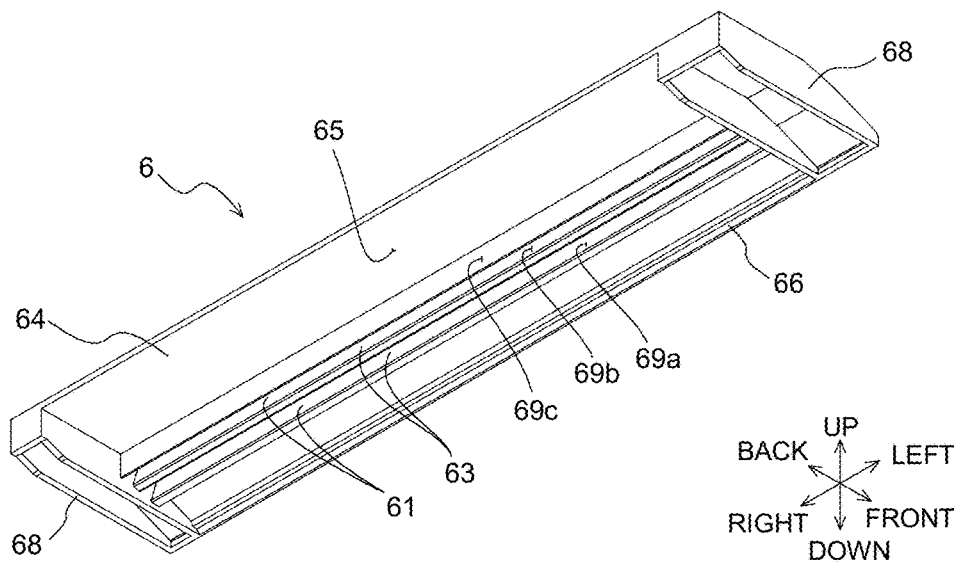
FIG. 28 is a perspective view of a lower side of the exhaust air guide 6 according to Embodiment 2.

FIG. 27 is a perspective view of an upper side of an exhaust air guide 6 according to Embodiment 2. FIG. 28 is a perspective view of a lower side of the exhaust air guide 6 according to Embodiment 2. With reference to FIGS. 27 and 28, a structure of each exhaust air guide 6 is described. The exhaust air guides 6 have a substantially rectangular external shape, and are placed over the exhaust apertures 12c and 12d and on the exhaust aperture 12e, with a longitudinal direction being along the left and right direction of the heating cooker 100A (see FIG. 24). In Embodiment 2, one exhaust air guide 6 is disposed over two exhaust apertures 12c and 12d (see FIGS. 24 and 25).

Each exhaust air guide 6 includes an upper plate 65 whose flat surface is disposed substantially horizontally, a front plate 66, an inclined plate 67 that is formed continuously between the upper plate 65 and the front plate 66 and that extends downward from back to front, and a pair of left and right side plates 68. A space that is surrounded by these plates is formed inside each exhaust air guide 6.

Each exhaust air guide 6 has air passages 63 extending therethrough in the up and down direction. A lower-end opening of each air passage 63 is called a first inlet 61, and an upper-end opening of each air passage 63 is called a first outlet 62. As shown in FIG. 28, a back side of each exhaust air guide 6 is not provided with a wall, and is provided with an opening. This opening is called a second outlet 64. Three ribs 69a, 69b, and 69c are disposed at a lower surface of each upper plate 65 and apart from each other by gaps, the three ribs 69a, 69b, and 69c being provided over the entire inside width of the exhaust air guide 6 and extending in a substantially up and down direction. The rib 69a that is nearest to the front is provided behind and apart from the front plate 66. By the gaps provided between adjacent ones of the ribs 69a, 69b, and 69c, two air passages 63 are formed.

As shown in FIG. 27, each inclined plate 67 provided at a front side of its corresponding exhaust air guide 6 extends downward in a forward direction. Opening sides of the first outlets 62 that are formed in the corresponding inclined plates 67 also extend downward in the forward direction similarly to the inclined plates 67. The first outlets 62 of Embodiment 2 are provided closer to a back side than the first outlets 22 of Embodiment 1, and are positioned toward the center in the front and back direction of the corresponding exhaust air guides 6. An area in which each inclined plate 67 exists in the front and back direction is longer than that in which each inclined plate 27 of Embodiment 1 exists, and the height of the front plates 66 is lower than the height of the front plates of Embodiment 1. Therefore, when seen by a user that uses the heating cooker 100A, the sense that each exhaust air guide 6 protrudes is reduced and each exhaust air guide 6 appears thin to the user, so that the design of the heating cooker 100A is improved.

As shown in FIG. 28, an opening side of each first inlet 61 is substantially parallel to the opening side of its corresponding first outlet 62 and is inclined downward in the forward direction. In Embodiment 2, by positioning lower ends of the ribs 69a, 69b, and 69c that form the air passages 63 closer to an upper side toward the back, the opening side of each first inlet 61 is inclined.

Figure 29:
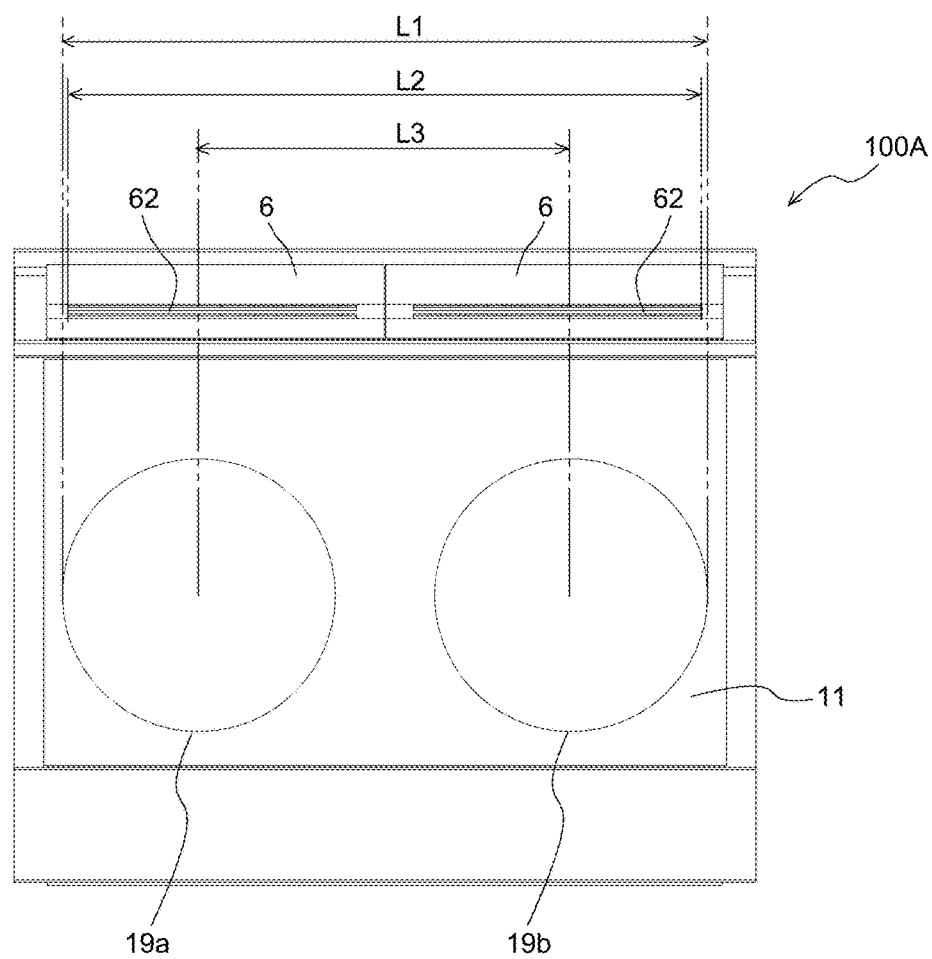
FIG. 29 is a plan view of the heating cooker 100A according to Embodiment 2.

FIG. 29 is a plan view of the heating cooker 100A according to Embodiment 2. L1 is the distance between both ends in the left and right direction of an area including the heating zones 19a to 19b, and, in Embodiment 2 in which the heating zone 19a is provided on a left end and the heating zone 19b is provided on a right end, L1 is the distance between the left end of the heating zone 19a and the right end of the heating zone 19b. L2 is the distance between both ends in the left and right direction of an area extending from one pair of first outlets 62 to the other pair of first outlets 62, and, in Embodiment 2 in which two exhaust air guides 6 are provided, L2 is the distance between left ends of the first outlets 62 of the left exhaust air guide 6 and right ends of the first outlets 62 of the right exhaust air guide 6. L3 is the distance between a center of the left-end heating zone 19a in a width direction and a center of the right-end heating zone 19b in the width direction. Even in Embodiment 2, similarly to Embodiment 1, the relationship L1>L2>L3 holds, and Embodiment 2 provides operational effects that are the same as those of Embodiment 1.

Figure 30:
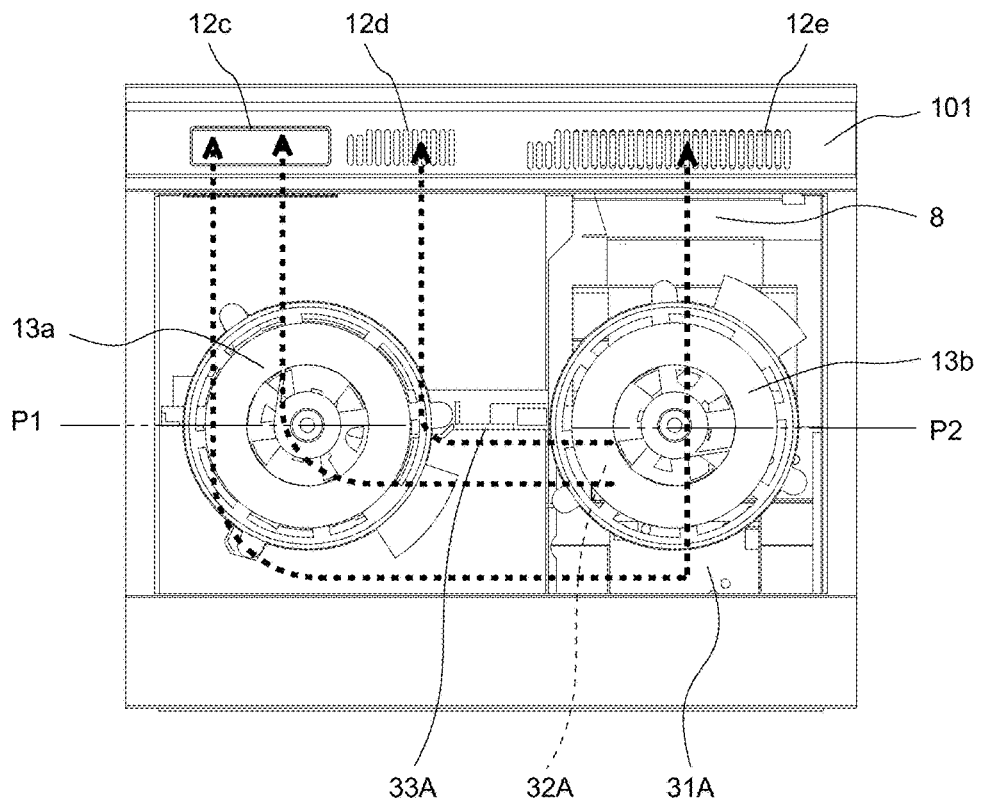
FIG. 30 is a plan view of the heating cooker 100A according to Embodiment 2 when the top plate 11 has been removed.
Figure 31:
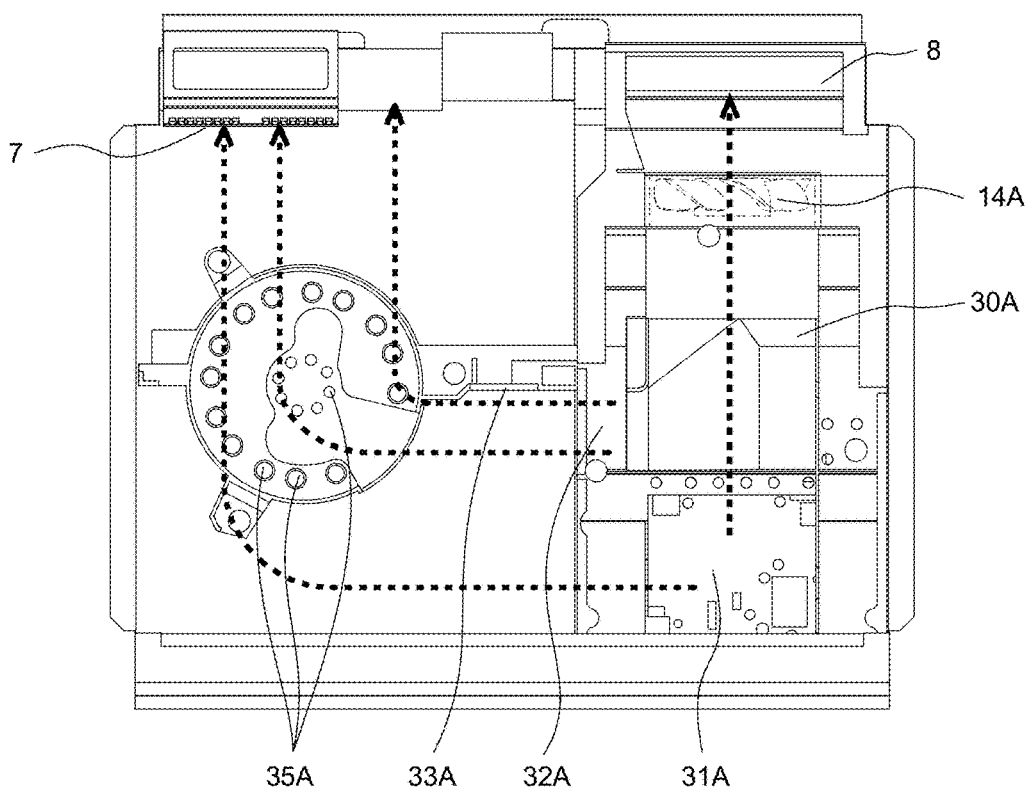
FIG. 31 illustrates the heating cooker 100A when heating coils 13a and 13b and an upper frame 101 have been removed from the heating cooker 100A in FIG. 30.

FIG. 30 is a plan view of the heating cooker 100A according to Embodiment 2 when the top plate 11 has been removed. P1 denotes the position of a center of the heating coil 13a in the front and back direction, and P2 denotes the position of a center of the heating coil 13b in the front and back direction. FIG. 31 illustrates the heating cooker 100A when the heating coils 13a and 13b and the upper frame 101 have been removed from the heating cooker 100A in FIG. 30.

As shown in FIGS. 30 and 31, at least a part of the first air outlet 31A and at least a part of the second air outlet 32A are provided on a front side relative to the center position P1 of the left heating coil 13a and on a front side relative to the center position P2 of the right heating coil 13b. In plan view, at least a part of the first air outlet 31A overlaps the heating coil 13b in the front and back direction. In plan view, at least a part of the first air outlet 31A overlaps the exhaust aperture 12e in the front and back direction. The first air outlet 31A, the heating coil 13b, and the exhaust aperture 12e are provided linearly in the front and back direction. Cooling air that has been blown out to a lower side of the heating coil 13b from the first air outlet 31A cools the heating coil 13b and linearly flows toward the exhaust aperture 12b disposed behind the heating coil 13b. Therefore, Embodiment 2 provides operational effects that are the same as those of Embodiment 1.

A part of cooling air from the second air outlet 32A and a part of cooling air from the first air outlet 31A are guided to the air guide plate 33A and flow through a region on the front side relative to the air guide plate 33A and toward the left heating coil 13a. When the first air outlet 31A and the second air outlet 32A are disposed on the front side of the center position P1 of the heating coil 13a, the cooling air is guided to a portion on the front side relative to the heating coil 13a. The cooling air is blown against the lower side of the heating coil 13a via the third air outlets 35A and cools the heating coil 13a. The cooling air that has cooled the heating coil 13a linearly flows toward the exhaust apertures 12c and 12d disposed behind the heating coil 13a. Therefore, Embodiment 2 provides operational effects that are the same as those of Embodiment 1.

Figure 32:
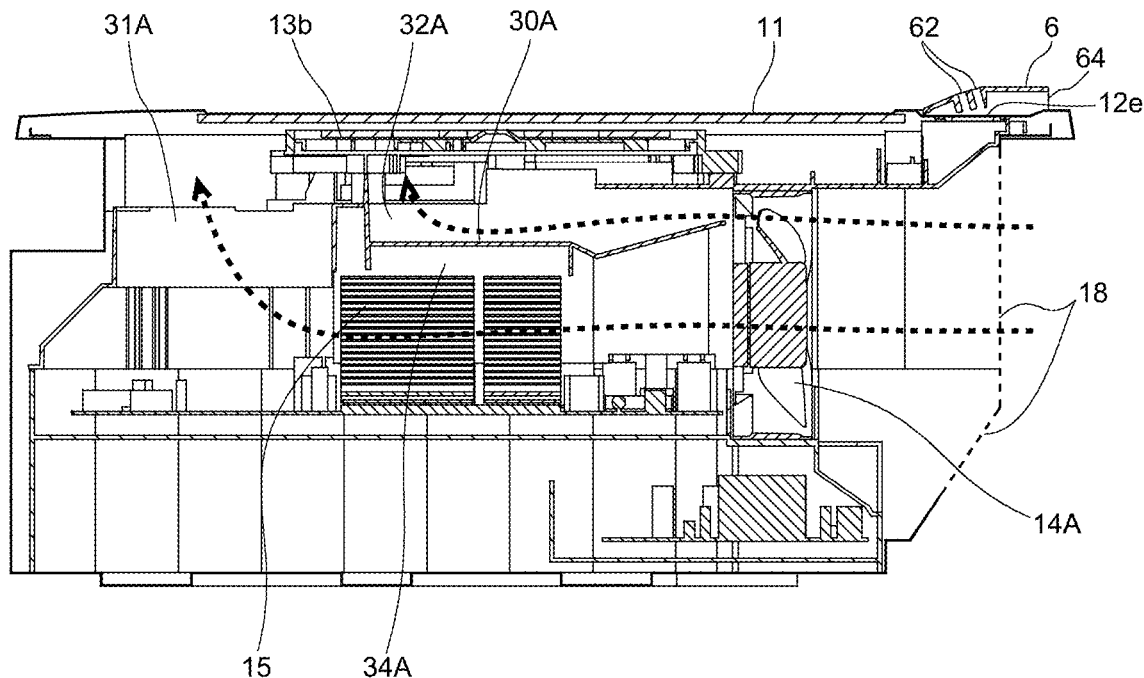
FIG. 32 is a side sectional view of the heating cooker 100A according to Embodiment 2.
Figure 33:
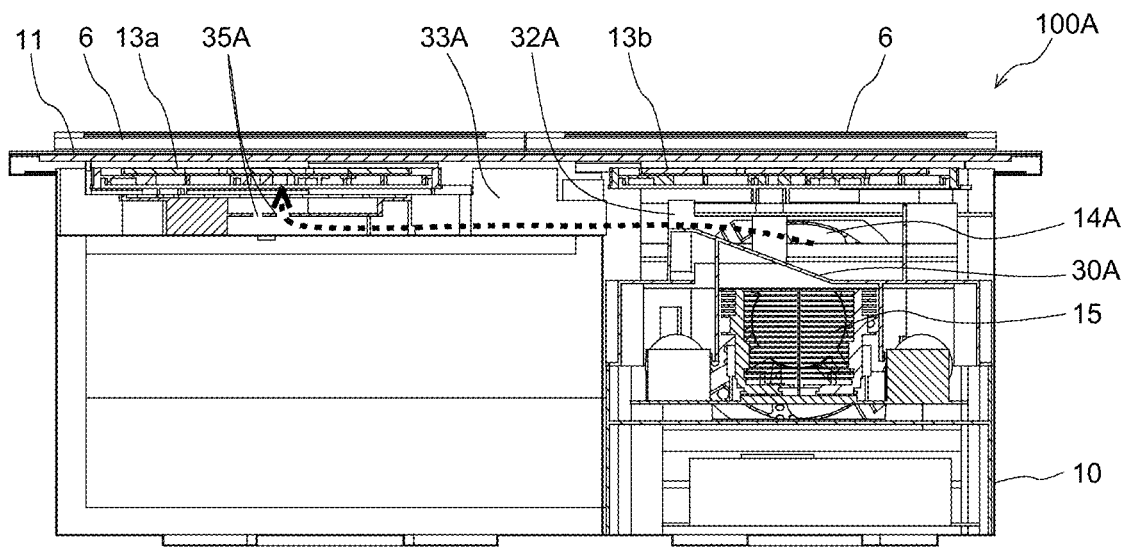
FIG. 33 is a front sectional view of the heating cooker 100A according to Embodiment 2.

FIG. 32 is a side sectional view of the heating cooker 100A according to Embodiment 2. FIG. 32 schematically shows a section that passes the air-sending device 14 and the first air outlet 31, and the left side of the drawing sheet is the front. FIG. 33 is a front sectional view of the heating cooker 100A according to Embodiment 2. FIG. 32 schematically shows a section that passes through the second air outlet 32A.

As shown in FIG. 32, two cooling-air air passages, that is, upper and lower cooling-air air passages are formed on a downstream side of the air-sending device 14A. The lower air passage is the air passage 34A formed inside the first cooling air guide 30A. The upper air passage is an air passage formed on an upper side of an upper surface of the first cooling air guide 30A. A part of the cooling air sent out from the air-sending device 14A cools the driving device 15 accommodated in the air passage 34A, while passing through the air passage 34A formed in the first cooling air guide 30A. A part of the cooling air that has flowed through the air passage 34A flows into a location below the heating coil 13b via the first air outlet 31A. The flow of the part of the cooling air that has flowed into the location below the heating coil 13b is as illustrated in FIGS. 30 and 31.

A remaining part of the cooling air sent out from the air-sending device 14A passes through the air passage formed on the upper side of the first cooling air guide 30A, and flows out from the second air outlet 32A. As shown in FIG. 33, the remaining part of the cooling air flows toward the left along the air guide plate 33A and flows into a location below the heating coil 13a via the third air outlets 35A. The flow of the cooling air that has flowed into the location below the heating coil 13a is as illustrated in FIGS. 30 and 31.

Figure 34:
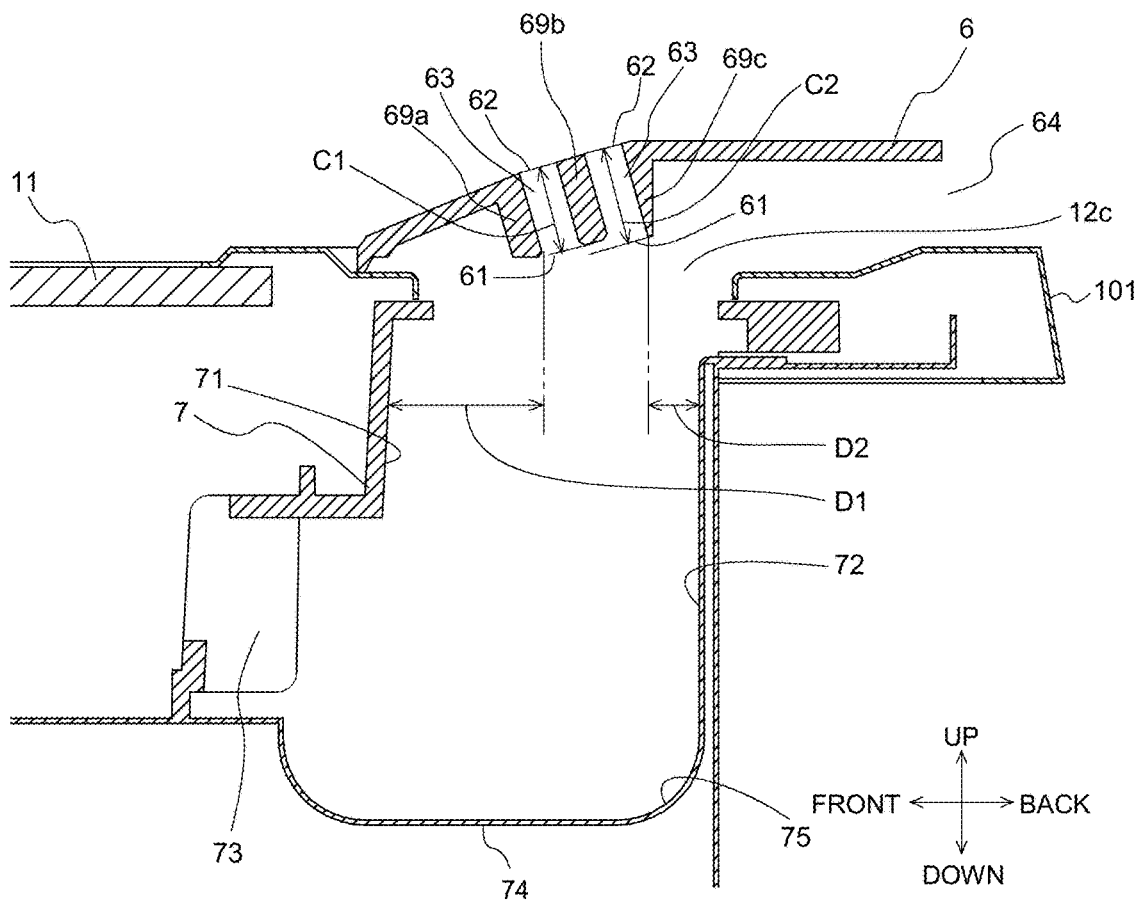
FIG. 34 is a partial sectional view of the vicinity of an exhaust aperture 12c according to Embodiment 2.

FIG. 34 is a partial sectional view of the vicinity of the exhaust aperture 12c according to Embodiment 2. The structure in which an axial length of each air passage 63, that is, a length from the first inlet 61 to the first outlet 62 is longer than the length of an opening side of the first inlet 61 in the front and back direction and the length of an opening side of the first outlet 62 in the front and back direction is the same as that of Embodiment 1. The structure in which the axis of each air passage 63 is tilted forward toward the first outlet 62 relative to the vertical direction is the same as that of Embodiment 1. As in Embodiment 1, a part of the cooling air that has flowed out from the exhaust aperture 12c flows out from the first outlets 62 via the air passages 63 and acts as a guiding air flow, and a remaining part flows out from the second outlet 64.

The third air guide 7 includes a back air guide wall 72 extending in the up and down direction and a front air guide wall 71 disposed apart from the back air guide wall 72 in the front and back direction. The front air guide wall 71 and the back air guide wall 72 are disposed so that their flat surfaces are opposite to each other. The back air guide wall 72 is disposed behind each first inlet 61. A flow passage that communicates with an upstream side of the exhaust aperture 12c is formed between the back air guide wall 72 and the front air guide wall 71. An air guide plate 73 is disposed on an upstream side of and a lower side of the front air guide wall 71. The position of the air guide plate 73 depends upon the position of an air-flow inlet for the third air guide 7. The air guide plate 73 is disposed so that its flat surface extends in the front and back direction. Although not shown in FIG. 34, a plurality of the air guide plates 73 are disposed apart from each other in the left and right direction of the housing 10. When such air guide plates 73 are disposed at the inlet of the third air guide 7, it is possible to reduce the degree of tilting of the air flow in the left and right direction.

A lower surface of the third air guide 7 is covered by a bottom plate 74. A curved surface 75 is continuously disposed between the bottom plate 74 and a lower end portion of the back air guide wall 72. Therefore, cooling air that has been guided to the air guide plates 73, that has moved from front to back, and that has flowed into the third air guide 7 is guided upward by the curved surface 75. Due to the Coanda effect, an air flow that flows along the back air guide wall 72 from the curved surface 75 is generated. That is, the curved surface 75 and the back air guide wall 72 function as air guide plates that guide upward the air flow that moves from front to back.

In FIG. 34, the shortest distance between the first inlet 61 and the front air guide wall 71 is denoted by D1. The shortest distance between the first inlet 61 and the back air guide wall 72 is denoted by D2. In Embodiment 2, the distance D2 is shorter than the distance D1. That is, the first inlet 61 is closer to the back air guide wall 72 than the front air guide wall 71. Therefore, as described above, a large amount of the air flow that flows upward along the back air guide wall 72 from the curved surface 75 due to the Coanda effect can flow into the first inlet 61. The air flows that have flowed into the air passages 63 from the first inlets 61 flow obliquely upward toward the first outlets 62. Due to the rectifying effect in the left and right direction by the air guide plates 73, the Coanda effect produced by the curved surface 75 and the back air guide wall 72, and the relationship of the distance D2<the distance D1, the air flows flowing from the first outlets 62 is turned to be guiding air flows moving obliquely upward and having little turbulence.

In FIG. 34, of the lengths of the three ribs 69a to 69c that form the air passages 63, the length of the rib 69c closest to the back is longest. Therefore, since the air flow guided by the back air guide wall 72 and moving upward is guided by a front surface of the rib 69c, the flow of the air flow into the first inlets 61 is speeded up. The ribs 69a to 69c that form the air passages 63 serve as air-passage resistors themselves and generate pressure loss. In respect of preventing entry of foreign substances, making it difficult to see the inside, and improving design, it is desirable that the width of each air passage 63 in the front and back direction be small. However, when the width of each air passage 63 in the front and back direction is small, the pressure loss is increased. Although the air passages 63 generate pressure loss in this way, by causing the length of the rib 69c to be long, the rib 69c functions as an air-flow guide and helps the air flow to flow into the air passages 63. In other words, when the rib 69c is made longer than the other ribs 69a and 69b and functions as an air-flow guide, even if the lengths of the air passages 63 are made short in the front and back direction or the lengths of the air passages 63 are made short, it is possible to suppress a reduction in the air speeds of the guiding air flows that flow out from the air passages 63. By causing the length of the rib 69c that is closest to the back side to be long, the rectifying effect by the rib 69c is increased and the precision with which the forward-tilt angle of the guiding air flows that flow out from the air passages 63 that are formed on the front side relative to the rib 69c can be increased. By generating the air flows that move obliquely upward and that have little turbulence, the effect of guiding the steam or the smoke by the air flows is increased.

Figure 35:
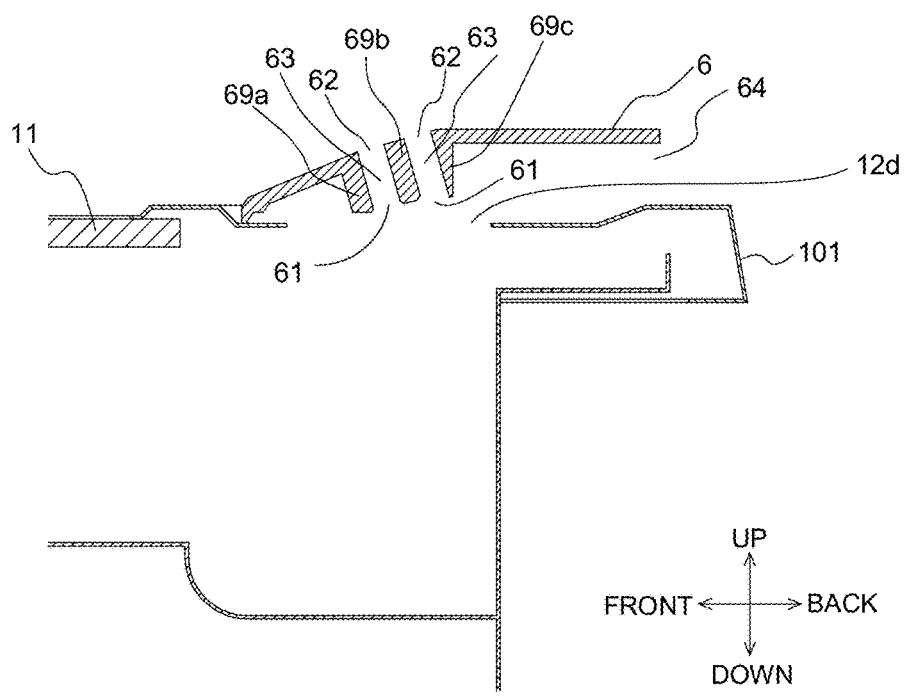
FIG. 35 is a partial sectional view of the vicinity of an exhaust aperture 12d according to Embodiment 2.

FIG. 35 is a partial sectional view of the vicinity of the exhaust aperture 12d according to Embodiment 2. The left side of the drawing sheet of FIG. 35 is the front of the heating cooker 100A. A third air guide 7 such as the third air guide 7 shown in FIG. 34 is not disposed on an upstream side of the exhaust aperture 12d. Therefore, air passages that reach the exhaust aperture 12d have a pressure loss that is smaller than the pressure loss of the air passages (see FIG. 34) that reach the exhaust aperture 12c. When the pressure loss of the air passages that reach the exhaust aperture 12c and the pressure loss of the air passages that reach the exhaust aperture 12d are caused to differ from each other, it is possible to adjust the air volume of the cooling air that flows into the exhaust aperture 12c and the air volume of the cooling air that flows into the exhaust aperture 12d. In Embodiment 2, by causing the pressure loss on the upstream side of the exhaust aperture 12d to be relatively small, the air volume of the air flow that flows into the exhaust aperture 12d is made relatively large. Therefore, non-uniformity between the air speed of the guiding air flows from the other exhaust apertures 12c and 12e and the air speed of the guiding air flow from the exhaust aperture 12d is reduced. By causing the uniformity between the air speeds of the guiding air flows from the three exhaust apertures 12c, 12d, and 12e to be increased, even if a cooking container is placed on either one of the left heating zone 19a and the right heating zone 19b, the steam or the smoke from the cooking container can be guided to the ventilator.

Figure 36:
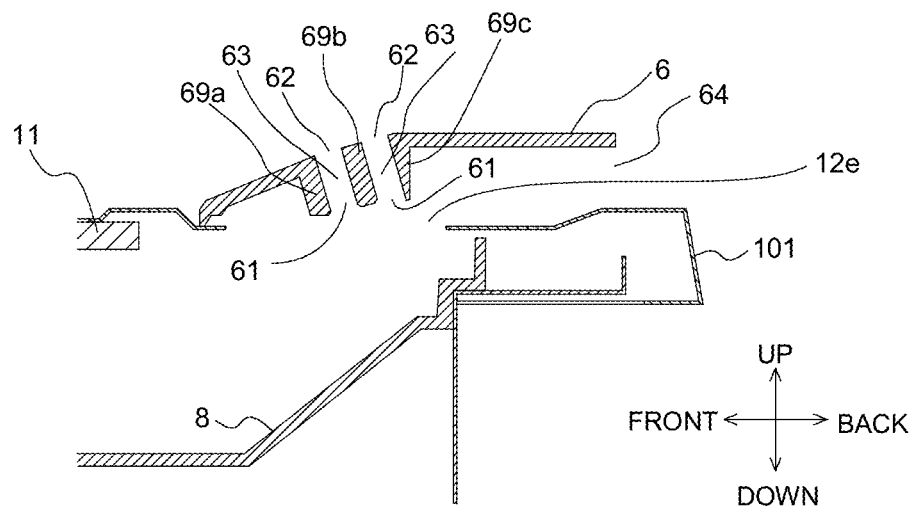
FIG. 36 is a partial sectional view of the vicinity of an exhaust aperture 12e according to Embodiment 2.

FIG. 36 is a partial sectional view of the vicinity of the exhaust aperture 12e according to Embodiment 2. The fourth air guide 8 is disposed on an upstream side of the exhaust aperture 12e. The fourth air guide 8 has an inclined surface that rises from front to back and that is formed at an upper surface, and an upper end of the inclined surface of the fourth air guide 8 is positioned below the exhaust aperture 12e. Cooling air (see FIG. 31) that is blown out from the first air outlet 31A and that moves toward the back flows out from the exhaust aperture 12e while being guided by the inclined surface of the fourth air guide 8 and flowing upward.

According to the heating cooker 100A of Embodiment 2, air flows flowing to the exhaust apertures 12c, 12d, and 12e from the first air outlet 31A and the second air outlet 32A can be suppressed from being tilted in the left and right direction. Therefore, the straightness of the air flows that exit from the exhaust apertures 12c, 12d, and 12e and flow out via the exhaust air guides 6 is increased, and it is possible to increase the action of guiding the steam or the smoke to the ventilator 201 by the air flows from the exhaust air guides 6. The first air outlet 31A and the second air outlet 32A are provided on the front side of the centers of the heating coils 13a and 13b, and distance to the exhaust apertures 12c, 12d, and 12e from the first air outlet 31A and the second air outlet 32A is provided. Therefore, tilting of the air flows in the left and right direction is suppressed by the time the air flows reach the exhaust apertures 12c, 12d, and 12e, and the effect of rectifying the tilted air flows to straight air flows is high. Since the air passages 63 of the exhaust air guides 6 have longer lengths than the lengths of the first outlets 62 of the air passages 63 in the front and back direction, the effect of rectifying in the front and back direction the air flows passing through the air passages 63 is increased, and the directivity of the guiding air flows that flow out from the first outlets 62 can be improved. By increasing the directivity of the guiding air flows, it is possible to increase the action of guiding the directed steam or smoke to the ventilator 201.

Embodiment 3

Figure 37:
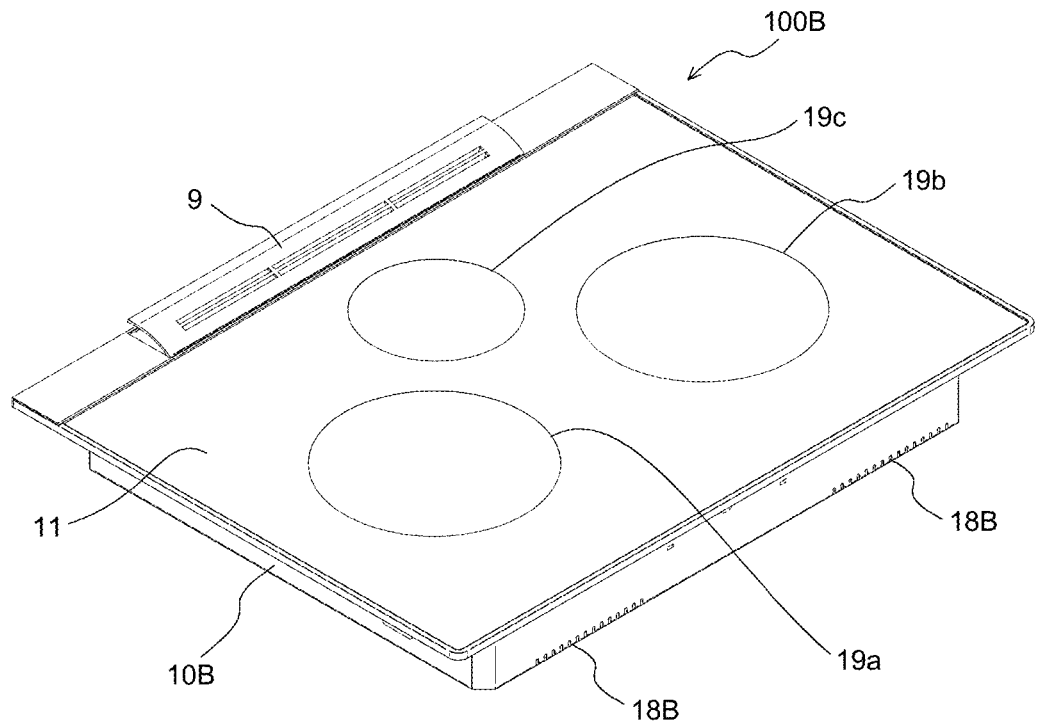
FIG. 37 is a perspective view of a heating cooker 100B according to Embodiment 3.

FIG. 37 is a perspective view of a heating cooker 100B according to Embodiment 3. The heating cooker 100B is provided with three heating zones 19a, 19b, and 19c. In Embodiment 3, one exhaust air guide 9 having a form that differs from the form of the exhaust air guides 2 of Embodiment 1 and the form of the exhaust air guides 6 of Embodiment 2 is provided. The height of a housing 10B is lower than the heights of the housings described in Embodiments 1 and 2. Air inlet ports 18B are formed in a bottom plate (see FIG. 44) from a front wall of the housing 10B.

Figure 38:
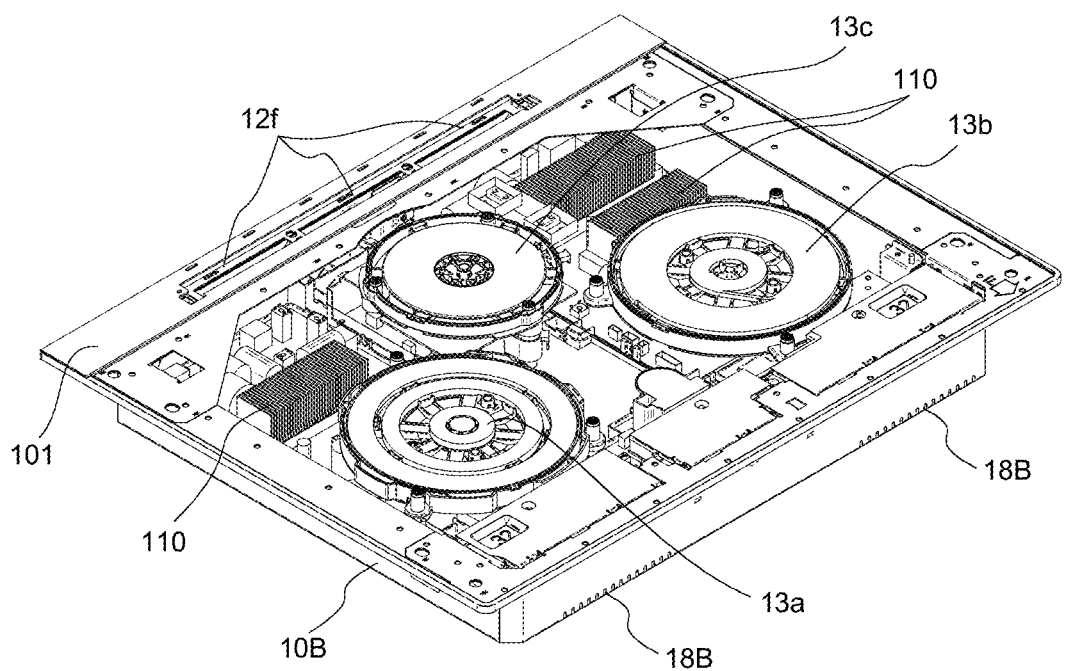
FIG. 38 is a perspective view of the heating cooker 100B according to Embodiment 3 when a top plate 11 thereof has been removed.

FIG. 38 is a perspective view of the heating cooker 100B according to Embodiment 3 when a top plate 11 thereof has been removed. Heating coils 13a, 13b, and 13c are disposed at positions that depend upon the positions of the respective heating zones 19a, 19b, and 19c shown in FIG. 37. In the housing 10B, exhaust apertures 12f are disposed behind the heating coils 13a to 13c. In Embodiment 3, three openings are formed, one in each exhaust aperture 12f. Heat-dissipating fins 110 of a driving device 15 (see FIG. 39) are disposed inside the housing 10B. In a front and back direction, the heat-dissipating fins 110 are disposed between the heating coil 13a and the exhaust apertures 12f and between the heating coil 13b and the exhaust apertures 12f.

Figure 39:
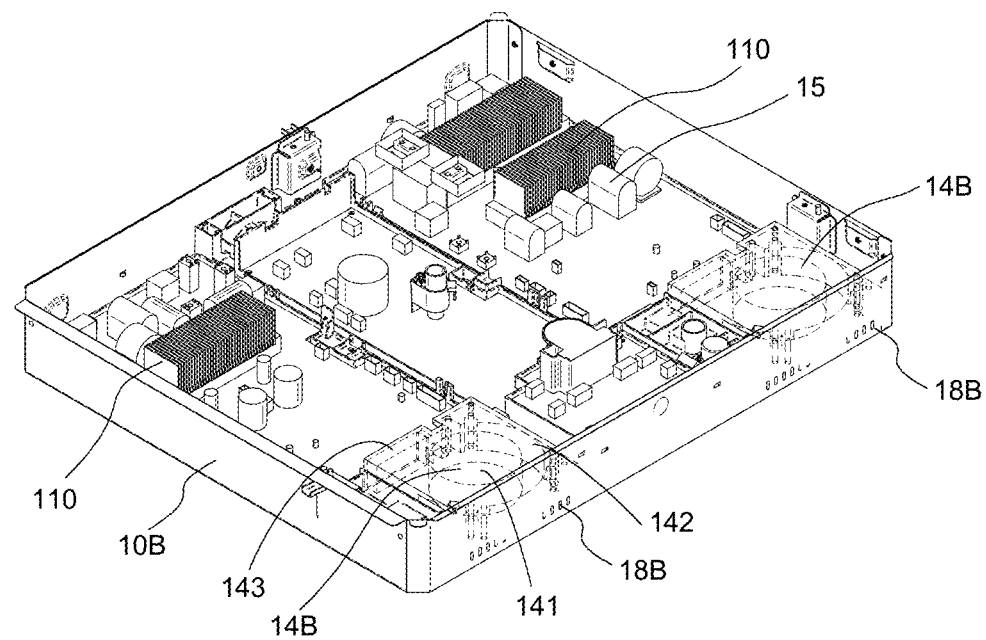
FIG. 39 is a perspective view illustrating an internal structure of the heating cooker 100B according to Embodiment 3.

FIG. 39 is a perspective view illustrating an internal structure of the heating cooker 100B according to Embodiment 3. FIG. 39 shows the internal structure when the heating coils 13a to 13c and an upper frame 101 have been removed from the state shown in FIG. 38. Two air-sending devices 14B having the same structure are disposed inside the housing 10B. Each air-sending device 14B includes a centrifugal fan 141 and a casing 142 that accommodates the fan 141 and that has an air outlet 143 through which an air flow from the fan 141 passes. In Embodiment 3, each casing 142 functions as a cooling air guide that guides the air flow from the fan 141 to the air outlet 143. The air outlets 143 of the air-sending devices 14B are disposed on a front side of the heating coils 13a to 13c (see FIG. 38) to face the back.

Figure 40:
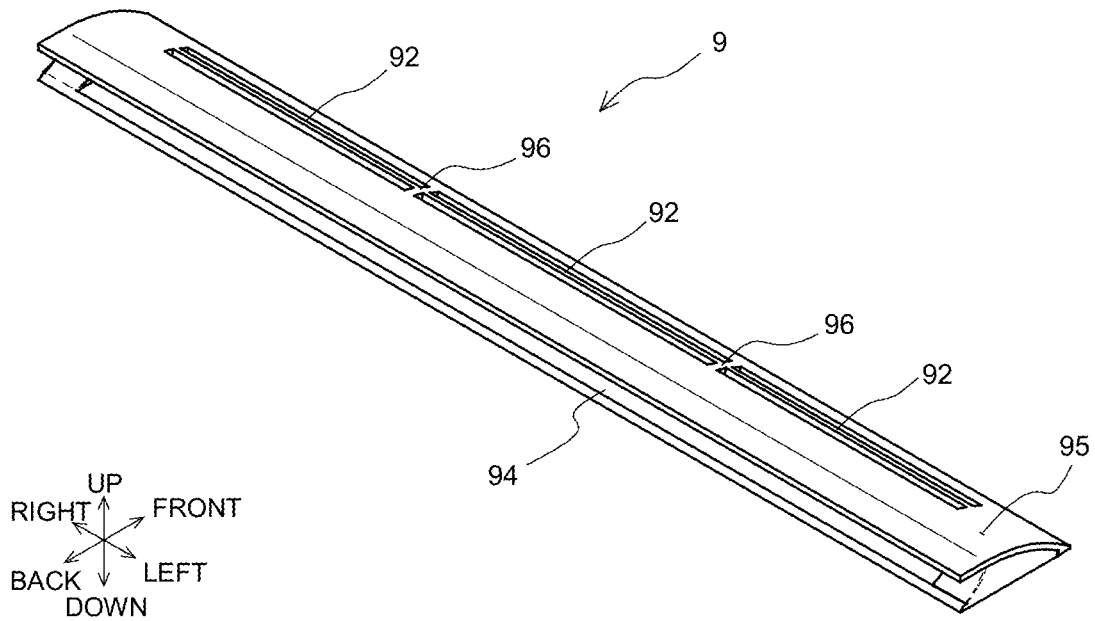
FIG. 40 is a perspective view of an upper side of an exhaust air guide 9 according to Embodiment 3.
Figure 41:
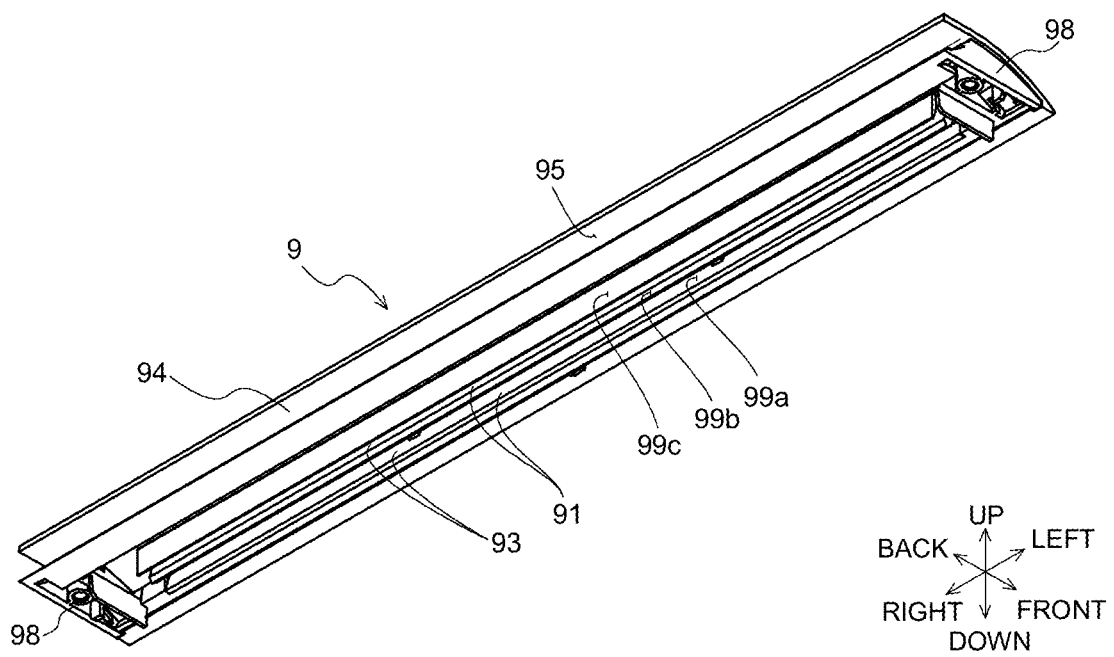
FIG. 41 is a perspective view of a lower side of the exhaust air guide 9 according to Embodiment 3.

FIG. 40 is a perspective view of an upper side of the exhaust air guide 9 according to Embodiment 3. FIG. 41 is a perspective view of a lower side of the exhaust air guide 9 according to Embodiment 3. With reference to FIGS. 40 and 41, a structure of the exhaust air guide 6 is described. The exhaust air guide 9 has a substantially rectangular external shape, and is placed over the exhaust apertures 12f, with a longitudinal direction being along a left and right direction of the heating cooker 100B (see FIG. 37). In Embodiment 3, one exhaust air guide 9 is disposed over the three openings of the exhaust apertures 12f (see FIGS. 37 and 38).

The exhaust air guide 9 includes an upper plate 95 whose inclined surface extends downward from back to front. In Embodiment 3, the upper plate 95 is a curved surface. A pair of left and right side plates 98 extending in the left and right direction are disposed on a lower surface of the upper plate 95.

Air passages 93 are formed in the exhaust air guide 9 and extend through the exhaust air guide 9 in the up and down direction. A lower-end opening of each air passage 93 is called a first inlet 91, and an upper-end opening of each air passage 93 is called a first outlet 92. As shown in FIG. 41, a back side of the exhaust air guide 9 is not provided with a wall, and is provided with an opening. The opening is called a second outlet 94. Three ribs 99a, 99b, and 99c are disposed at the lower surface of the upper plate 95 and apart from each other by gaps, the three ribs 99a, 99b, and 99c being provided over the entire inside width of the exhaust air guide 9 and extending in a substantially up and down direction. The gaps between corresponding ones of adjacent ribs 99a, 99b and 99c form two rows of air passages 93 in the front and back direction.

As shown in FIG. 40, first outlets 92 are separated in the left and right direction by partitions 96. By separating the first outlets 92 from each other, exhaust air is divided. The separated first outlets 92 are disposed at positions where the first outlets 92 are opposite to a corresponding one of the three openings of the respective exhaust apertures 12f (see FIG. 38). Similarly to the upper plate 95 that is inclined in a forward direction, opening sides of the first outlets 92 formed in the exhaust air guide 9 extend downward in the forward direction.

Figure 42:
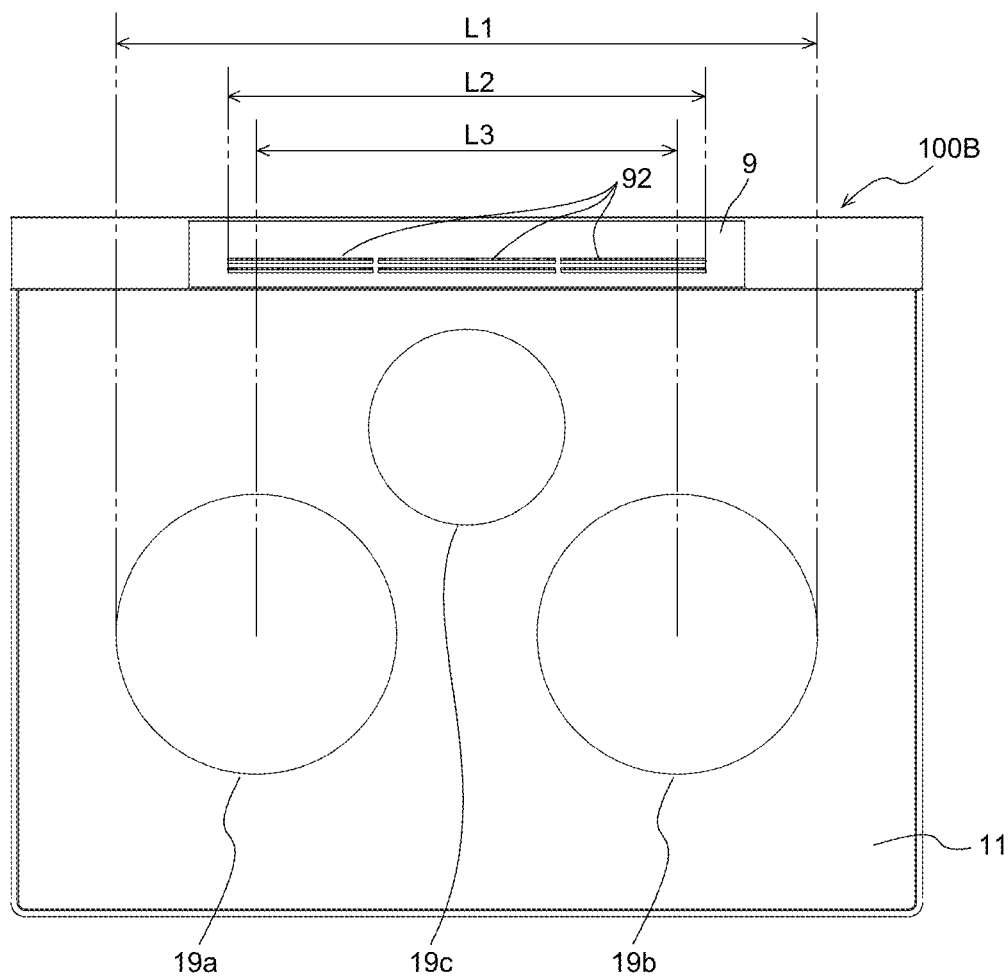
FIG. 42 is a plan view of the heating cooker 100B according to Embodiment 3.

FIG. 42 is a plan view of the heating cooker 100B according to Embodiment 3. L1 is the distance between both ends in the left and right direction of an area including the heating zones 19a and 19b, and, in Embodiment 3 in which the heating zone 19a is provided on a left end and the heating zone 19b is provided on a right end, L1 is the distance between the left end of the heating zone 19a and the right end of the heating zone 19b. L2 is the distance between both ends in the left and right direction of an area extending from one pair of first outlets 92 to another pair of first outlets 92. L3 is the distance between a center of the left-end heating zone 19a in a width direction and a center of the right-end heating zone 19b in the width direction. Even in Embodiment 3, similarly to Embodiment 1, the relationship L1>L2>L3 is kept, and Embodiment 3 provides operational effects that are the same as those of Embodiment 1.

Figure 43:
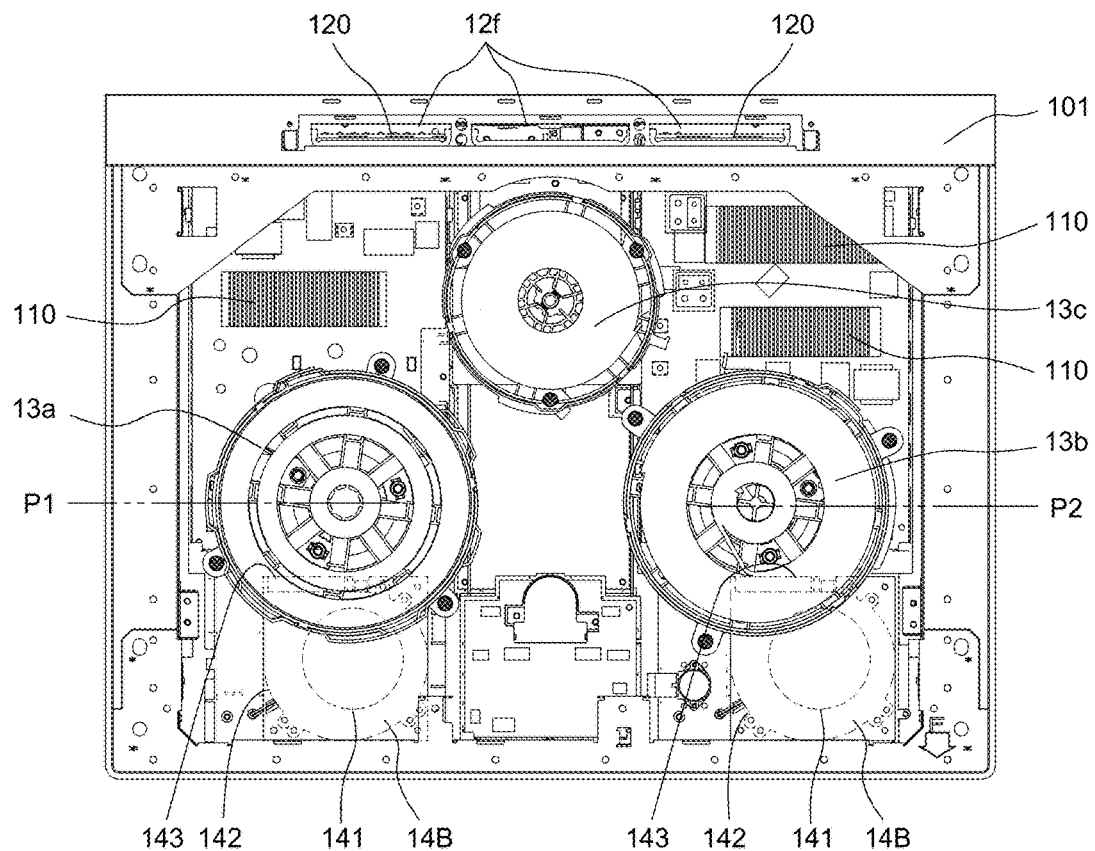
FIG. 43 is a plan view of the heating cooker 100B according to Embodiment 3 when the top plate 11 has been removed.

FIG. 43 is a plan view of the heating cooker 100B according to Embodiment 3 when the top plate 11 has been removed. P1 denotes the position of a center of the heating coil 13a in the front and back direction, and P2 denotes the position of a center of the heating coil 13b in the front and back direction. As shown in FIG. 43, the air outlet 143 of the left air-sending device 14B is disposed on a front side relative to the center position P1 of the heating coil 13a, and the air outlet 143 of the right air-sending device 14B is disposed on a front side relative to the center position P2 of the heating coil 13b. In plan view, at least a part of the air outlet 143 overlaps the exhaust aperture 12f in the front and back direction. The air outlet 143, the heating coil 13a, and the exhaust aperture 12f are provided linearly in the front and back direction, and the air outlet 143, the heating coil 13b, and the exhaust aperture 12f are provided linearly in the front and back direction. Cooling air that has been blown out from the air outlets 143 by operating the fans 141 cools the heating coils 13a and 13b and linearly flows toward the exhaust apertures 12f disposed behind the heating coils 13a and 13b. Therefore, linear guiding air flows that flow out via the exhaust apertures 12f and the exhaust air guide 9 are generated, and are suppressed from diffusing in the left and right direction.

The heat-dissipating fins 110 are disposed inside the housing 10B so that flat surfaces of the fins extend in a direction in which air flows that flow out from the air outlets 143 flow (in Embodiment 3, the front and back direction). The heat-dissipating fins 110 are disposed behind the heating coils 13a and 13b and on a front side relative to the exhaust apertures 12f. The heat-dissipating fins 110 are disposed on air-flow flow paths extending from the air outlets 143 to the exhaust apertures 12f, and the flat surfaces of the heat-dissipating fins 110 function as rectifying units that suppress turbulence in the left and right direction of the air flows. As shown at locations behind the heating coil 13b in FIG. 43, a plurality of heating-dissipating fins 110 may be disposed in the front and back direction. This makes it possible to increase the rectifying effect by the heat-dissipating fins 110. Due to the rectifying effect of the heat-dissipating fins 110, linear guiding air flows that flow out via the exhaust apertures 12f and the exhaust air guide 9 are generated, and are suppressed from diffusing in the left and right direction.

Figure 44:
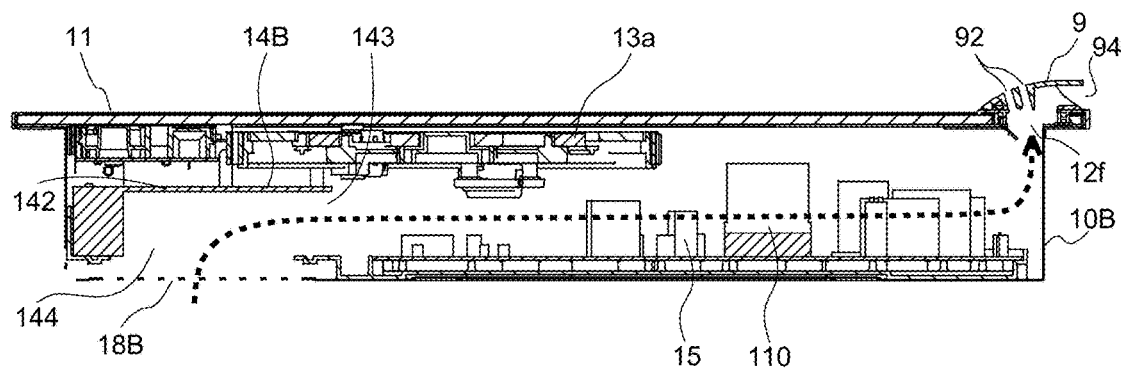
FIG. 44 is a side sectional view of the heating cooker 100B according to Embodiment 3.

FIG. 44 is a side sectional view of the heating cooker 100B according to Embodiment 3. FIG. 44 schematically shows a section that passes the air-sending device 14B and the left heating coil 13a, and the left side of the drawing sheet is the front. The air inlet ports 18B of the housing 10B are formed in a bottom surface from the front wall of the housing 10B. An air inlet 144 in the casing 142 of the air-sending device 14B is provided at a position where the air inlet 144 is opposite to the air inlet ports 18B. When the air-sending device 14B operates, air is sucked in via the air inlet ports 18B and cooling air is blown out toward a lower side of the heating coil 13a from the air outlet 143 of the air-sending device 14B. An air flow that has been blown out cools the heating coil 13a while passing the lower side of the heating coil 13a, and cools the driving device 15 while passing the vicinity of the driving device 15. The cooling air is rectified by the flat surfaces of the heat-dissipating fins 110 and flows toward the exhaust aperture 12f, and is discharged from the first outlets 92 and the second outlets 94 of the exhaust air guide 9.

Figure 45:
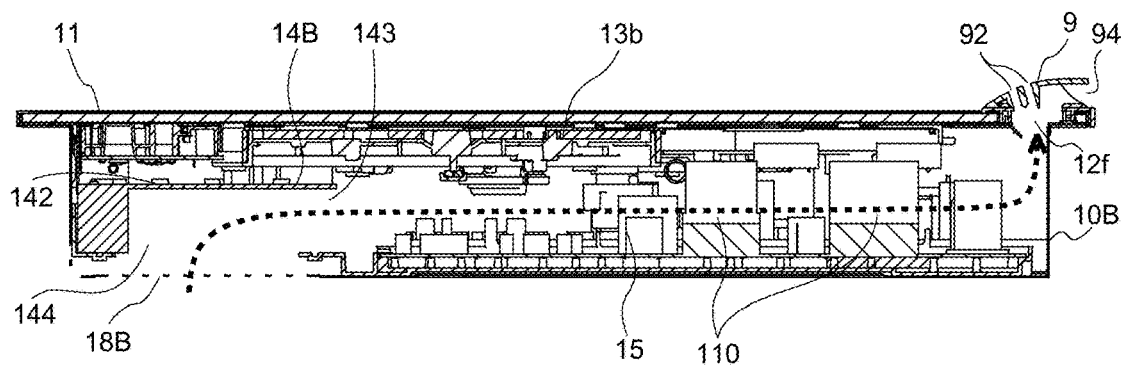
FIG. 45 is a side sectional view of the heating cooker 100B according to Embodiment 3.

FIG. 45 is a side sectional view of the heating cooker 100B according to Embodiment 3. FIG. 45 schematically shows a section that passes the air-sending device 14B and the right heating coil 13b, and the left side of the drawing sheet is the front side. The flow of air flow is the same as the flow of air flow illustrated in FIG. 44. Since two heat-dissipating fins 110 are disposed behind the heating coil 13b shown in FIG. 45, the rectifying effect by the heat-dissipating fins 110 is increased.

Figure 46:
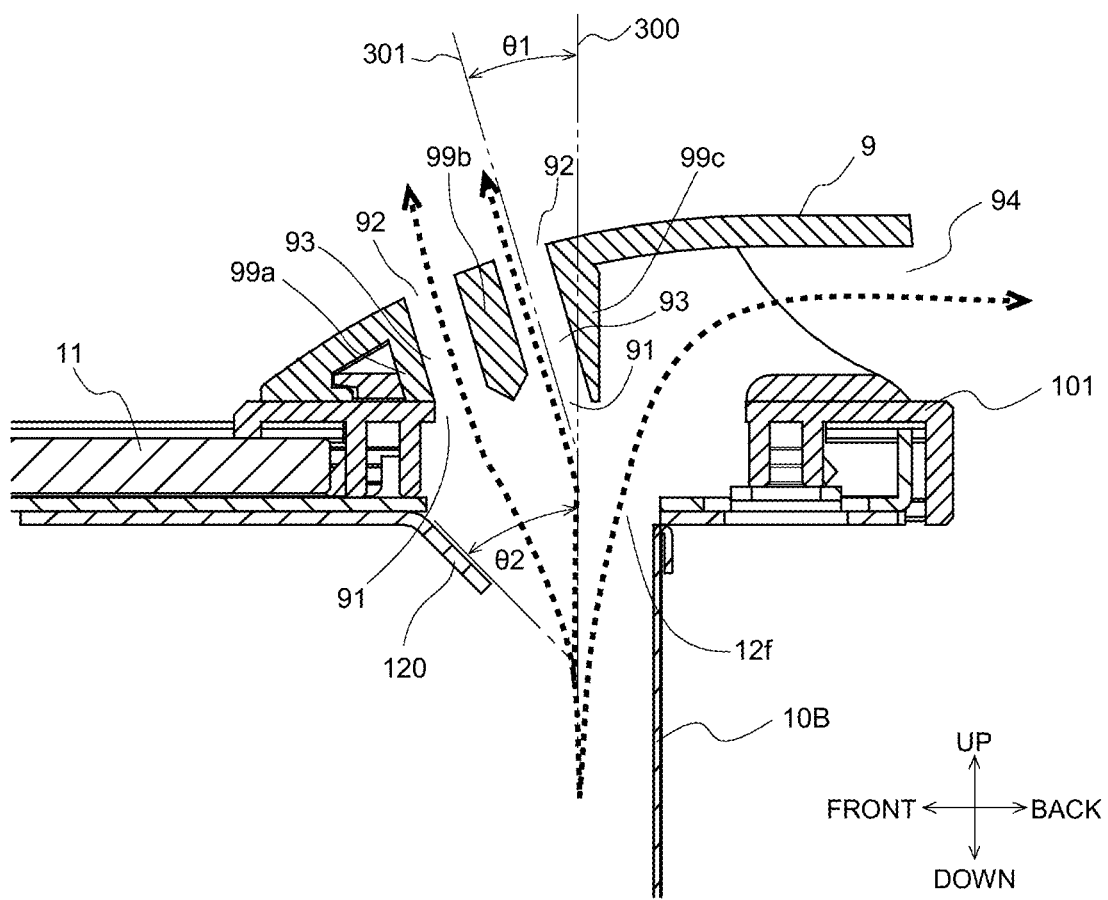
FIG. 46 is a partial sectional view of the vicinity of an exhaust aperture 12f according to Embodiment 3.

FIG. 46 is a partial sectional view of the vicinity of an exhaust aperture 12f according to Embodiment 3. The left side of the drawing sheet of FIG. 46 is the front side of the heating cooker 100B. The structure in which an axial-direction length of each air passage 93, that is, a length from the first inlet 91 to the first outlet 92 is longer than a length of an opening side of the first inlet 91 in the front and back direction and a length of an opening side of the first outlet 92 in the front and back direction is the same as the structures of Embodiments 1 and 2. The structure in which each air passage 93 is tilted forward toward the first outlet 92 relative to a vertical direction is the same as the structure of Embodiment 1. A vertical line 300, an axis 301 of the air passage 93, and a tilt angle θ1 are the same as those defined in Embodiment 1.

An air guide plate 120 is disposed on an edge of a through exhaust aperture 12f in the up and down direction. The air guide plate 120 is positioned on an upstream side of the first inlets 91 and on a front side relative to a rear end portion of each first inlet 91. The air guide plate 120 is plate-shaped and has an inclined surface that extends obliquely downward toward the back from a front edge of the exhaust aperture 12f. Although the tilt direction of each air passage 93 is the same as the tilt direction of the air guide plate 120, an angle θ2 that the inclined surface of the air guide plate 120 forms with the vertical line 300 is greater than the tilt angle θ1. Due to such a structure, an air flow that flows toward the exhaust aperture 12f from the inside of the housing 10B is guided to a lower portion of the air passage 93 by the air guide plate 120, and the flow of the air flow into the front air passage 93 is speeded up. Since turbulence of the air flow is suppressed by the air guide plate 120, the air flow that passes through the air passage 93 and flows out from the first outlet 92 is suppressed from being diffused, and the action of the air flow as a guiding air flow can be increased. Since pressure loss of the air flow that flows into the air passage 93 from the exhaust aperture 12f is suppressed by the air guiding action of the air guide plate 120, it is possible to reduce the load on the air-sending device 14B compared to the load on the air-sending device when an air guide plate 120 is not provided.

According to the heating cooker 100B of Embodiment 3, the air flows flowing to the exhaust apertures 12f from the air outlets 143 can be suppressed from tilting in the left and right direction. Therefore, the air flows that exit from the exhaust apertures 12f and flow out via the exhaust air guide 9 travel in a more straight line, and it is possible to increase the action of guiding the steam or the smoke to the ventilator 201 by using the air flows from the exhaust air guide 9. The air outlets 143 are disposed on the front side relative to the centers of the heating coils 13a and 13b, and distance to the exhaust apertures 12f from the air outlets 143 is provided. Therefore, tilting of the air flows in the left and right direction is suppressed by the time the air flows reach the exhaust apertures 12f, and the effect of rectifying the tilted air flows to allow them to be straight air flows is high. Since the air passages 93 of the exhaust air guide 9 have lengths longer than the lengths of the first outlets 92 of the air passages 93 in the front and back direction, the effect of rectifying in the front and back direction the air flows passing the air passages 93 is increased, and the directivity of the guiding air flows that flow out from the first outlets 92 can be improved. By increasing the directivity of the guiding air flows, it is possible to increase the action of guiding the directed steam or smoke to the ventilator 201.

REFERENCE SIGNS LIST 2 exhaust air guide 4 first air guide 5 second air guide 6 exhaust air guide 7 third air guide 8 fourth air guide 9 exhaust air guide 10 housing 10B housing 11 top plate 12a exhaust aperture 12b exhaust aperture 12c exhaust aperture 12d exhaust aperture 12e exhaust aperture 12f exhaust aperture 13a heating coil 13b heating coil 13c heating coil 14 air-sending device 14A air-sending device 14B air-sending device 15 driving device 18 air inlet port 18B air inlet port 19a heating zone 19b heating zone 19c heating zone 21 first inlet 22 first outlet 23 air passage 24 second outlet 25 upper plate 26 front plate 27 inclined plate 28 side plate 29a rib 29b rib 30 first cooling air guide 30A first cooling air guide 31 first air outlet 31A first air outlet 32 second air outlet 32A second air outlet 33 second cooling air guide 33A air guide plate 34 air passage 34A air passage 35 air outlet 35A third air outlet 41 first rectifying plate 42 second rectifying plate 43 outer frame 44 air passage 51 first air guide plate 52 second air guide plate 53 air passage 61 first inlet 62 first outlet 63 air passage 64 second outlet 65 upper plate 66 front plate 67 inclined plate 68 side plate 69a rib 69b rib 69c rib 71 front air guide wall 72 back air guide wall 73 air guide plate 74 bottom plate 75 curved surface 91 first inlet 92 first outlet 93 air passage second outlet 95 upper plate 96 partition 98 side plate 99a rib 99b rib 99c rib 100 heating cooker 100A heating cooker 100B heating cooker 101 upper frame 110 heat-dissipating fin 120 air guide plate 141 fan 142 casing 143 air outlet 144 air inlet 200 kitchen furniture 201 ventilator 202 kitchen wall 210 cooking container 300 vertical line 301 axis 302 vertical line

The invention claimed is:

1. A heating cooker comprising:
a housing having an exhaust aperture formed on an upper surface thereof, the housing having a front side, a back side opposite the front side, a left side between the front side and the back side, and a right side between the front side and the back side and opposite the left side;
a top plate disposed on the housing, and provided with a heating zone disposed, in plan view, closer to the front side of the housing relative to the exhaust aperture;
an induction heating coil configured to perform induction heating to heat a heating target placed on the heating zone;
an air-sending device;
a cooling air guide having an air outlet, and configured to guide an air flow from the air-sending device to the air outlet; and
an exhaust air guide disposed over the exhaust aperture, the exhaust air guide being formed with an air passage, a first inlet, a first outlet, and a second outlet, the air passage extending from the first inlet to the first outlet located above the first inlet,
in plan view, the air outlet of the cooling air guide and the exhaust aperture being aligned with each other in a front and back direction running between the front side and the back side of the housing,
in plan view, the air outlet of the cooling air guide and the induction heating coil being aligned with each other in the front and back direction,
in plan view, the air outlet of the cooling air guide being arranged on a front side of a center of the induction heating coil closest to the front side of the housing,
the air passage of the exhaust air guide having a length longer than a length of the first outlet of the air passage in the front and back direction,
the second outlet being formed closer to the back side of the housing with respect to the first outlet, and having a second direction of opening that opens in a direction different from a first direction of opening of the first outlet,
the exhaust air guide being configured to divide an air flow flowing out from the exhaust aperture into an air flow flowing in the first outlet and an air flow flowing in the second outlet.

2. The heating cooker of claim 1, wherein a center of the first outlet of the air passage of the exhaust air guide in the front and back direction is positioned on a front side of a center of the first inlet of the air passage of the exhaust air guide in the front and back direction.

3. The heating cooker of claim 1, wherein, when the air-sending device operates, an air speed of an air flow flowing out from the second outlet is lower than an air speed of an air flow flowing out from the first outlet.

4. The heating cooker of claim 1, wherein an axis of the air passage of the exhaust air guide is tilted forward with respect to the front side of the housing relative to a vertical line in a range greater than 0 degrees and less than or equal to 35 degrees.

5. The heating cooker of claim 1, wherein a rectifying plate is disposed, in plan view, at a position where at least a part of the rectifying plate overlaps the first inlet of the exhaust air guide in an up and down direction.

6. The heating cooker of claim 1, further comprising:
a back air guide wall disposed below and behind the first inlet, the back air guide wall guiding upward an air flow moving from front to back.

7. The heating cooker of claim 6, further comprising:
a front air guide wall disposed below the first inlet and apart from the back air guide wall on a front side relative to the back air guide wall,
wherein a flat surface of the back air guide wall and a flat surface of the front air guide wall are opposite to each other, and
wherein the first inlet is disposed closer to the back air guide wall than to the front air guide wall.

8. The heating cooker of claim 1, wherein among lengths of walls forming the air passage of the exhaust air guide, the length of a rearmost wall, with respect to the back side of the housing, along an axis of the air passage is longest.

9. The heating cooker of claim 1, wherein, in a left and right direction of the housing running between the left side and the right side of the housing, the first outlet is provided between a left end of the heating zone closer to the left side of the housing and a right end of the heating zone closer to the right side of the housing.

10. The heating cooker of claim 1, wherein, in a left and right direction of the housing running between the left side and the right side of the housing, a center of the heating zone is disposed between a left end of the first outlet closer to the left side of the housing and a right end of the first outlet closer to the right side of the housing.

11. The heating cooker of claim 1, further comprising:
an air guide plate disposed on an upstream side of the first inlet and on a front side relative to a rear end portion of the first inlet,
wherein a flat surface of the air guide plate is tilted forward relative to a vertical line,
wherein an axis of the air passage of the exhaust air guide is tilted forward relative to the vertical line, and
a tilt angle of the flat surface of the air guide plate is larger than a tilt angle of the axis of the air passage of the exhaust air guide.

\* \* \* \* \*